United States Patent [19]
Turuta

[11] Patent Number: 5,579,215
[45] Date of Patent: Nov. 26, 1996

[54] POWER CONVERSION DEVICE WITH SNUBBER ENERGY REGENERATING CIRCUIT

[75] Inventor: Yukinori Turuta, Kanagawa-ken, Japan

[73] Assignee: Kabushiki Kaisha Toshiba, Kawasaki, Japan

[21] Appl. No.: 521,329

[22] Filed: Aug. 30, 1995

[30] Foreign Application Priority Data

Sep. 8, 1994 [JP] Japan ................................ 6-214754
Feb. 27, 1995 [JP] Japan ................................ 7-038216

[51] Int. Cl.$^6$ .................................................. H02H 7/122
[52] U.S. Cl. ............................................ 363/57; 363/135
[58] Field of Search ............................ 363/55, 57, 58, 363/135, 136, 137

[56] References Cited

U.S. PATENT DOCUMENTS

| | | | |
|---|---|---|---|
| 4,747,036 | 5/1988 | Ichikawa et al. | 363/54 |
| 5,075,838 | 12/1991 | Schnetzka, II et al. | 363/58 X |
| 5,341,283 | 8/1994 | Niederer | 363/58 |
| 5,483,192 | 1/1996 | Tai | 363/57 X |

OTHER PUBLICATIONS

The National Convention of the Institute of Electrical Engineers of Japan, "Simulation of Resistance Loss Recovery Operation in a Package Snubber System for a Module," Hiroshi Narita et al., No. 492, 1993, pp. 5–27, 5–28.

Primary Examiner—Peter S. Wong
Assistant Examiner—Y. J. Han
Attorney, Agent, or Firm—Oblon, Spivak, McClelland, Maier & Neustadt, P.C.

[57] ABSTRACT

A power conversion device including a plurality of bridge connected self-turn-off modules. Each of the self-turn-off modules includes a plurality of self-turn-off devices connected in series and a plurality of first snubber circuits, each including a first series circuit of a first snubber capacitor and a first snubber diode. Each of the first snubber circuits is connected in parallel with one of the self-turn-off devices to form a first parallel circuit, respectively. The self-turn-off module further includes a snubber energy regenerating circuit including a regenerating transformer and a first auxiliary switch connected in series with a primary winding of the regenerating transformer. A secondary winding of the regenerating transformer is adapted for connecting to an outer power source. The self-turn-off module also includes a plurality of first gate circuits, each for driving one of the self-turn-off devices, respectively, and a second gate circuit for driving the first auxiliary switch. The second gate circuit turns on the first auxiliary switch after the self-turn-off devices are turned on. The snubber energy regenerating circuit is actuated by turning on of the first auxiliary switch thereby to discharge energies stored in the first snubber capacitors to regenerate the energies to the outer power source through the secondary winding of the regenerating transformer.

10 Claims, 21 Drawing Sheets

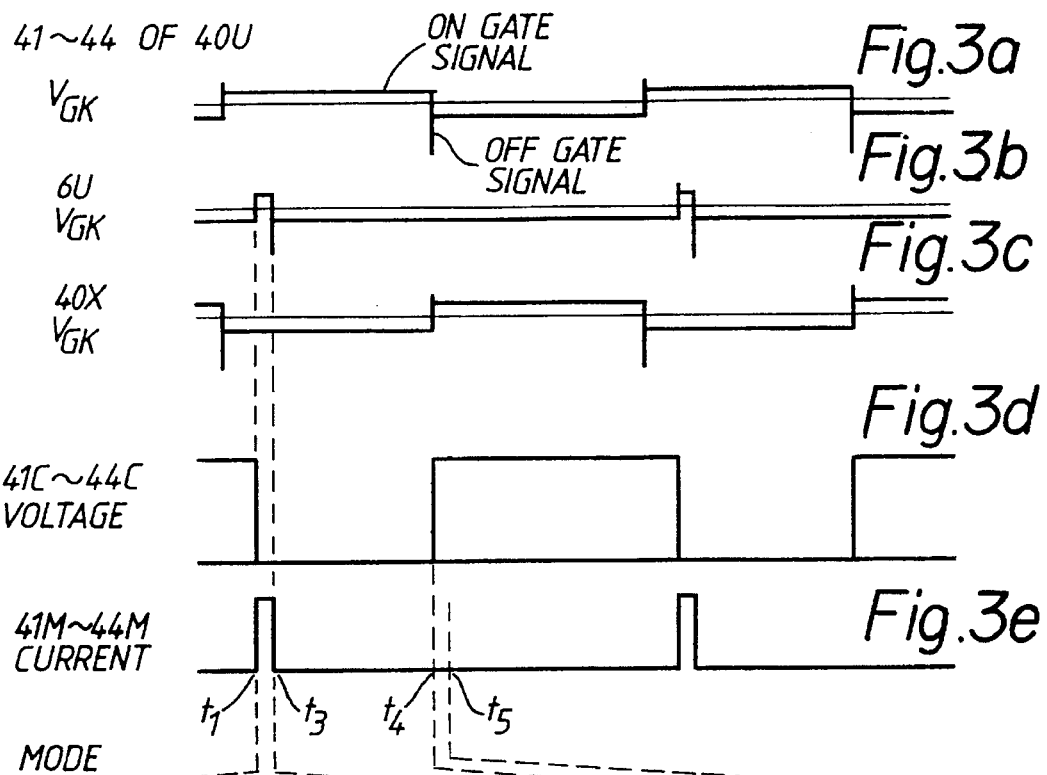
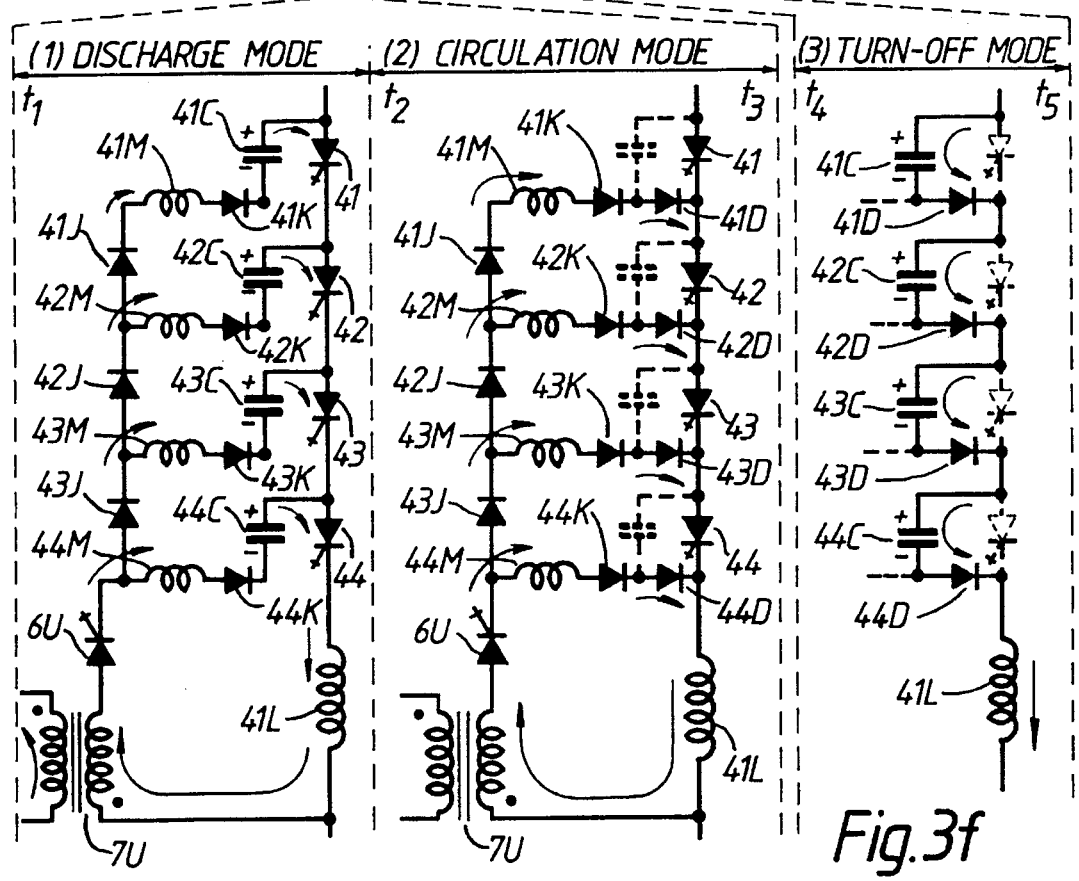

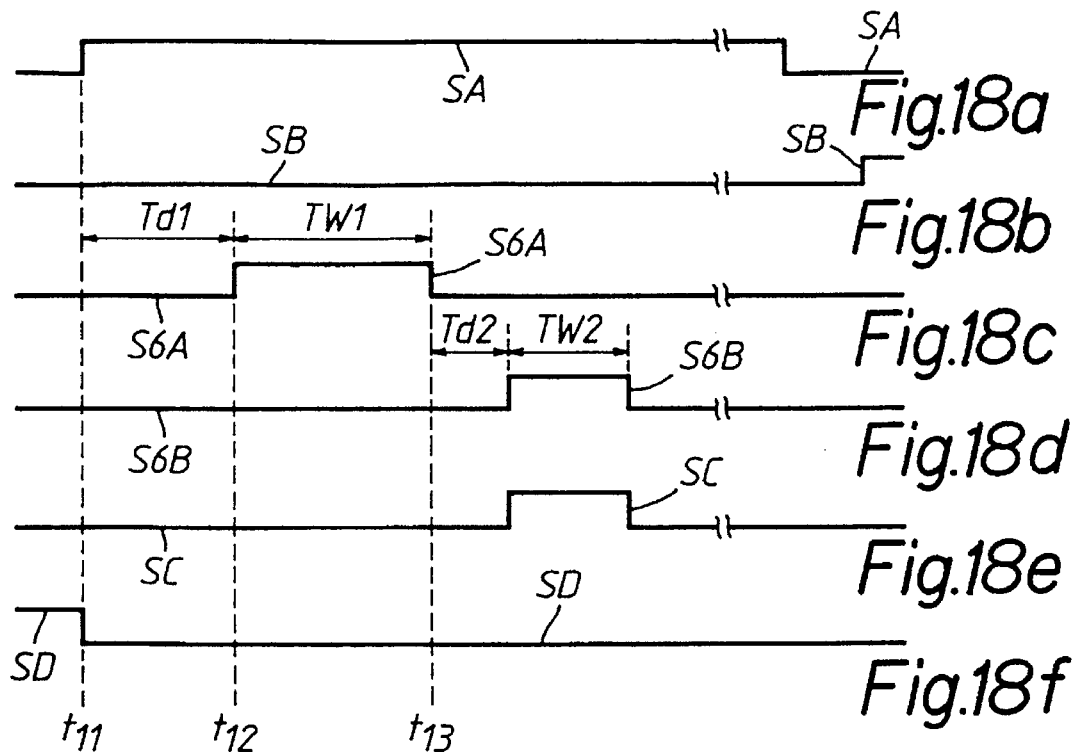
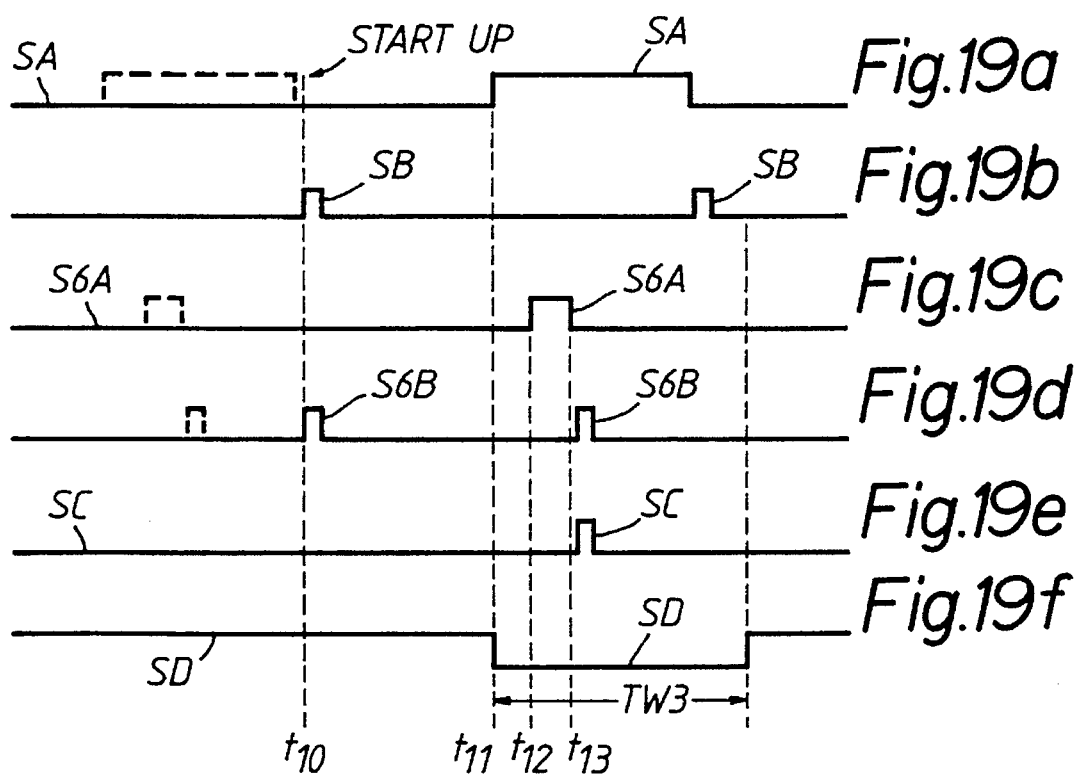

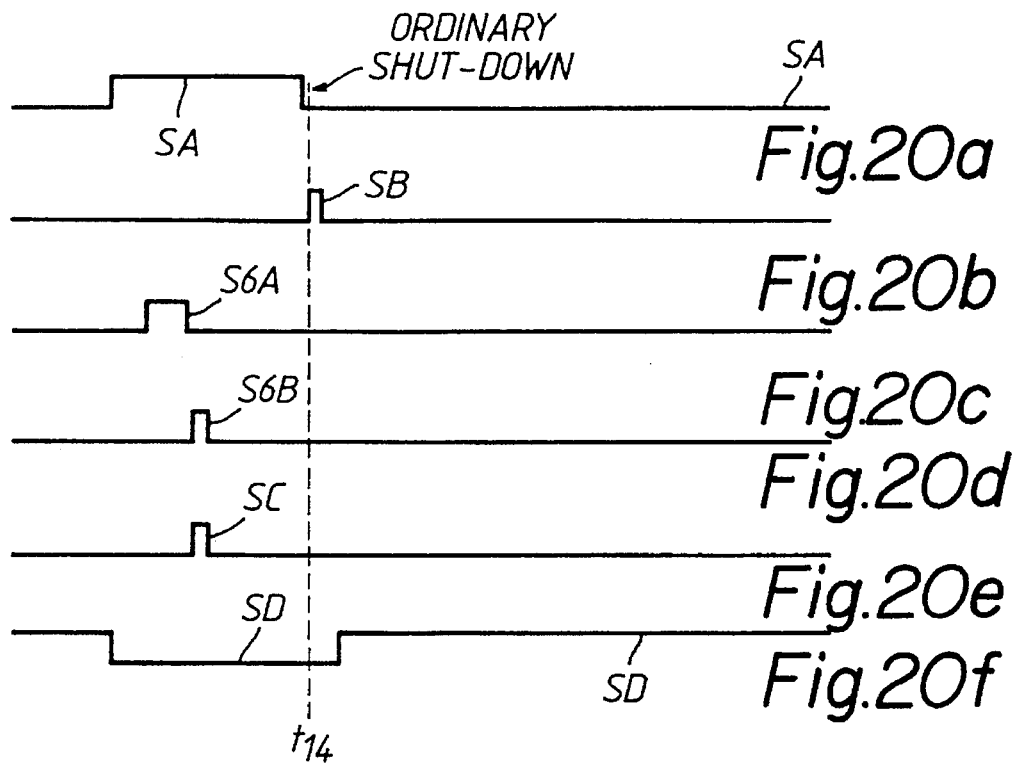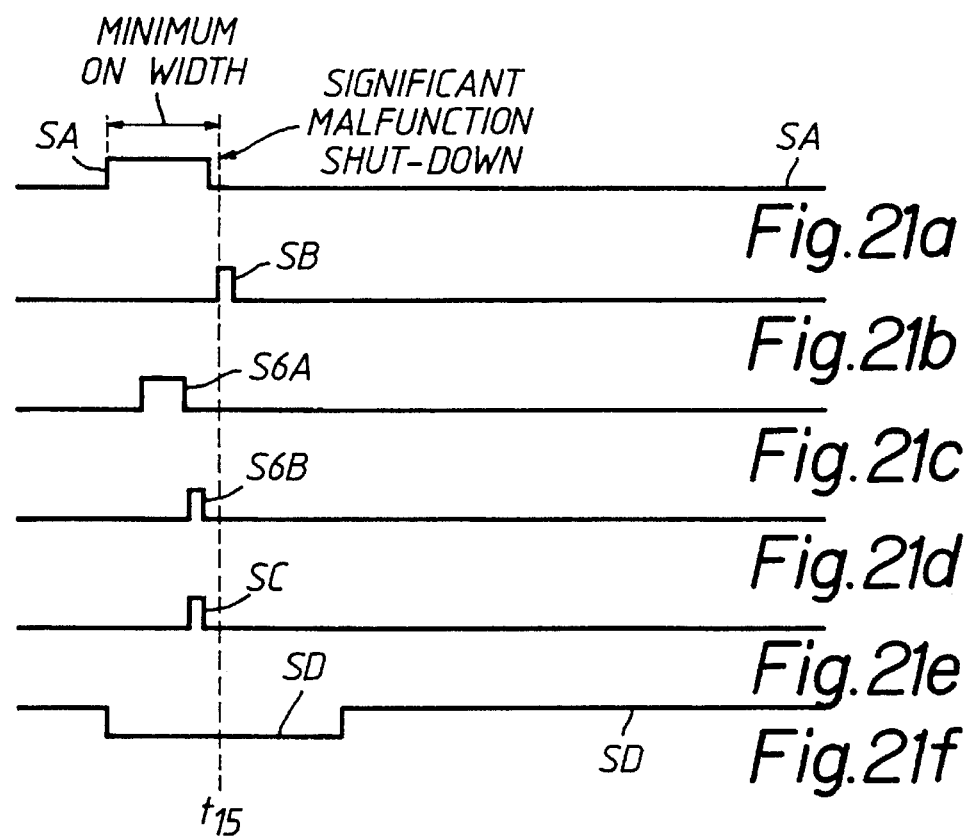

POWER CONVERSION DEVICE WITH SNUBBER ENERGY REGENERATING CIRCUIT

BACKGROUND OF THE INVENTION

1. Field of the Invention

This invention relates to a power conversion device composed of self-turn-off devices with snubber energy regenerating circuits, and more particularly to a power conversion device composed of a plurality of series connected self-turn-off devices with multistage snubber energy regenerating circuits.

2. Description of the Related Art

For power system control and/or magnetic levitation transport etc., it has now become the practice to employ such a type of circuitry as a multiple-inverter composed of a plurality of ultra-high capacity inverters, connected by a transformer, of a few tens through a few hundreds MVA class constructed. by connecting in series a plurality of self-turn-off devices such as gate turn-off thyristors (hereinbelow called GTOs). In such an ultra-high capacity GTO inverter, heat is generated with the considerable power loss resulting from resistance loss in the anode reactors and snubber circuits provided to protect GTOs. Research and development is therefore being conducted with the aim of decreasing such heat loss. As a prior art for recovering the heat loss of the snubber circuits and anode reactors to the power source end, a package snubber system for a module shown in FIG. 23 is proposed, which is disclosed in Paper No. 492 of the National convention of the Institute of Electrical Engineers of Japan published in 1993.

In FIG. 23, there are provided GTO modules 30 and 40. GTO modules 30 and 40 are composed of series connected GTOs 31 to 34 and series connected GTOs 41 to 44, respectively. There are further provided small-capacity individual snubber circuits composed of snubber diodes 31D to 34D and 41D to 44D, snubber capacitors 31C to 34C and 41C to 44C, and snubber resistors 31R to 34R and 41R to 44R, respectively. Each of the small-capacity individual snubber circuits is connected in parallel with one of GTOs 31 to 34 and 41 to 44, respectively. There are also provided package snubber circuits composed of capacitors 36C and 46C and diodes 31S and 44S, respectively. Each of the package snubber circuits is connected in parallel with one of series connected GTOs 31 to 34 in GTO module 30 and series connected GTOs 41 to 44 in GTO module 40, respectively. Anode reactors 31L and 41L are connected in series with series connected GTO modules 30 and 40 between a positive terminal P and a negative terminal N. An energy recovery circuit at an upper arm is composed of a recovery capacitor 35C which is charged through a diode 2S, a DC/DC converter 50 and a divided filter capacitor 21A. Likewise, an energy recovery circuit at a lower arm is composed of a recovery capacitor 45C which is charged through a diode 45S, a DC/DC converter 70 and a divided filter capacitor 21B.

In the arrangement of this prior art example, with ON/OFF of GTO module 30, the energy possessed by anode reactor 31L and package snubber capacitor 36C which has been heat loss is shifted into recovery capacitor 35C, and the stored energy of this recovery capacitor 35C is regenerated to divided filter capacitor 21A at the power source end using DC/DC converter 50. Likewise, with ON/OFF of GTO module 40, the energy possessed by anode reactor 41L and package snubber capacitor 45C which has been heat loss is shifted to recovery capacitor 45C, and the stored energy of this recovery capacitor 45C is regenerated to divided filter capacitor 21B at the power source end using DC/DC converter 70. Thus, the construction is such that the package snubber loss and anode reactor loss are regenerated to the power source.

However, the prior art example described above is subject to the following problem. Specifically, since an energy regeneration scheme is not devised for each individual snubber circuit, the snubber loss still exists in the form of heat loss. Accordingly, the problem of energy regeneration of a plurality of multistage snubber circuits is not at all solved. Furthermore, in addition to ON/OFF control of the main GTOs, the control of the DC/DC converters is required, resulting a new problem that the control of the power conversion device becomes complicated.

SUMMARY OF THE INVENTION

Accordingly, one object of this invention is to provide a power conversion device composed of self-turn-off devices with snubber energy regenerating circuits capable of regenerating the energy of the individual snubber circuits to the main circuit with a simplified construction.

Another object of this invention is to provide a power conversion device composed of self-turn-off devices with multistage snubber energy regenerating circuits capable of regenerating the energy of the individual snubber circuits and anode reactors to the main circuit and gate power sources with a simplified construction.

These and other objects of this invention can be achieved by providing a power conversion device including a plurality of bridge connected self-turn-off modules. Each of the self-turn-off modules includes a plurality of self-turn-off devices connected in series and a plurality of first snubber circuits, each including a first series circuit of a first snubber capacitor and a first snubber diode. Each of the first snubber circuits is connected in parallel with one of the self-turn-off devices to form a first parallel circuit, respectively. The self-turn-off module further includes a snubber energy regenerating circuit including a regenerating transformer and a first auxiliary switch connected in series with a primary winding of the regenerating transformer. A secondary winding of the regenerating transformer is adapted for connecting to an outer power source. The self-turn-off module also includes a plurality of first gate circuits, each for driving one of the self-turn-off devices, respectively, and a second gate circuit for driving the first auxiliary switch. The second gate circuit turns on the first auxiliary switch after the self-turn-off devices are turned on. The snubber energy regenerating circuit is actuated by turning on of the first auxiliary switch so as to form a plurality of first closed circuits, thereby to discharge energies stored in the first snubber capacitors through the first closed circuits to regenerate the energies to the outer power source through the secondary winding of the regenerating transformer. Each of the first closed circuits includes a series circuit of the first auxiliary switch, the primary winding of the regenerating transformer and one of the first parallel circuits, respectively.

According to one aspect of this invention there can be provided a power conversion device including a plurality of bridge connected self-turn-off modules. Each of the self-turn-off modules includes a self-turn-off device, a snubber circuit including a snubber capacitor, connected in parallel with said self-turn-off device, and a snubber energy regenerating circuit including a regenerating transformer, an auxiliary switch and a reactor. The auxiliary switch and the reactor are connected in series with a primary winding of the regenerating transformer. A secondary winding of the regenerating transformer is adapted for connecting to an outer power source. The self-turn-off module further includes a first gate circuit for driving the self-turn-off device and a second gate circuit including a third photocoupler and a fourth photocoupler for driving the auxiliary switch. The snubber energy regenerating circuit is actuated by turning on of the auxiliary switch to discharge a snubber energy stored in the snubber capacitor and to regenerate the snubber energy to the outer power source through the secondary winding of the regenerating transformer. The first gate circuit includes a first photocoupler to which an ON signal is applied, a first ON gate circuit connected to the first photocoupler for supplying an ON gate current to the self-turn-off device based on the ON signal, a driving circuit connected to the first photocoupler for applying the ON signal to the third photocoupler of the second gate circuit, a second photocoupler to which an OFF signal is applied, a first OFF gate circuit connected to the second photocoupler for supplying an OFF gate current to the self-turn-off device based on the OFF signal, and a driving circuit connected to the second photocoupler for applying the OFF signal to the fourth photocoupler of the second gate circuit. The second gate circuit includes a first pulse generating circuit connected to the third photocoupler to receive the ON signal for generating a first pulse signal with a first pulse width by delaying the ON signal by a first delay time, a second ON gate circuit connected to the first pulse generating circuit for supplying the first pulse signal as an ON gate current, to the auxiliary switch, a second pulse generating circuit connected to the first pulse generating circuit to receive the first pulse signal for generating a second pulse signal with a second pulse width by delaying the first pulse signal by a second delay time, and a second OFF gate circuit connected to the second pulse generating circuit for supplying the second pulse signal as an OFF gate current to the auxiliary switch.

According to another aspect of this invention, there can be achieved by providing a power conversion device including a plurality of bridge connected self-turn-off modules. Each of the self-turn-off modules includes a plurality of self-turn-off devices connected in series, and a plurality of first snubber circuits, each including a first series circuit of a first snubber capacitor and a first snubber diode. Each of the first snubber circuits is connected in parallel with one of the self-turn-off devices to form a first parallel circuit, respectively. The self-turn-off module also includes a snubber energy regenerating circuit including a regenerating transformer and a first auxiliary switch connected in series with a primary winding of the regenerating transformer. A secondary winding of the regenerating transformer is adapted for connecting to an outer power source. The self-tun-off module further includes a plurality of series connected first gate circuits, each for driving one of the self-turn-off devices, respectively, and a second gate circuit for driving the first auxiliary switch. The snubber energy regenerating circuit is actuated by turning on of the first auxiliary switch so as to form a plurality of first closed circuits, thereby to discharge energies stored in the first snubber capacitors through the first closed circuits to regenerate the energies to the outer power source through the secondary winding of the regenerating transformer. Each of the first closed circuits includes a series circuit of the first auxiliary switch, the primary winding of the regenerating transformer, and one of the first parallel circuits, respectively. Each of the first gate circuits includes a first photocoupler to which an ON signal is applied, a first ON gate circuit connected to the first photocoupler for supplying an ON gate current to the self-turn-off device based on the ON signal, a driving circuit connected to the first photocoupler for applying the ON signal to a photocoupler of one of the first gate circuits and the second gate circuit connected in the next stage, a second photocoupler to which an OFF signal is applied, a first OFF gate circuit connected to the second photocoupler for supplying an OFF state current to the self-turn-off device based on the OFF signal, and a driving circuit connected to the second photocoupler for applying the OFF signal to a photocoupler of one of the first gate circuits and the second gate circuit connected in the next stage. The second gate circuit includes a third photocoupler for receiving the ON signal from the first gate circuit, a first pulse generating circuit connected to the third photocoupler to receive the ON signal for generating a first pulse signal with a first pulse width by delaying the ON signal by a first delay time, a second ON gate circuit connected to the first pulse generating circuit for supplying the first pulse signal as an ON gate current to the auxiliary switch, a fourth photocoupler for receiving the OFF signal from the first gate circuit, a second pulse generating circuit connected to the first pulse generating circuit to receive the first pulse signal for generating a second pulse signal with a second pulse width by delaying the first pulse signal by a second delay time, and a second OFF gate circuit connected to the second pulse generating circuit for supplying the second pulse signal as an OFF gate current to the auxiliary switch.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 is a view given in explanation of the operation of the GTO module shown in FIG. 1;

FIG. 18 is a timing chart given in explanation of the operation of the second gate circuit of FIG. 17;

FIG. 19 is a timing chart given in explanation of the operation on start-up of the second gate circuit of FIG. 17;

FIG. 20 is a timing chart given in explanation of the operation on ordinary shut-down of the second gate circuit of FIG. 17;

FIG. 21 is a timing chart given in explanation of the operation on significant malfunction shut-down of the second gate circuit of FIG. 17;

DETAILED DESCRIPTION OF THE PREFERRED EMBODIMENTS

Figure 1:
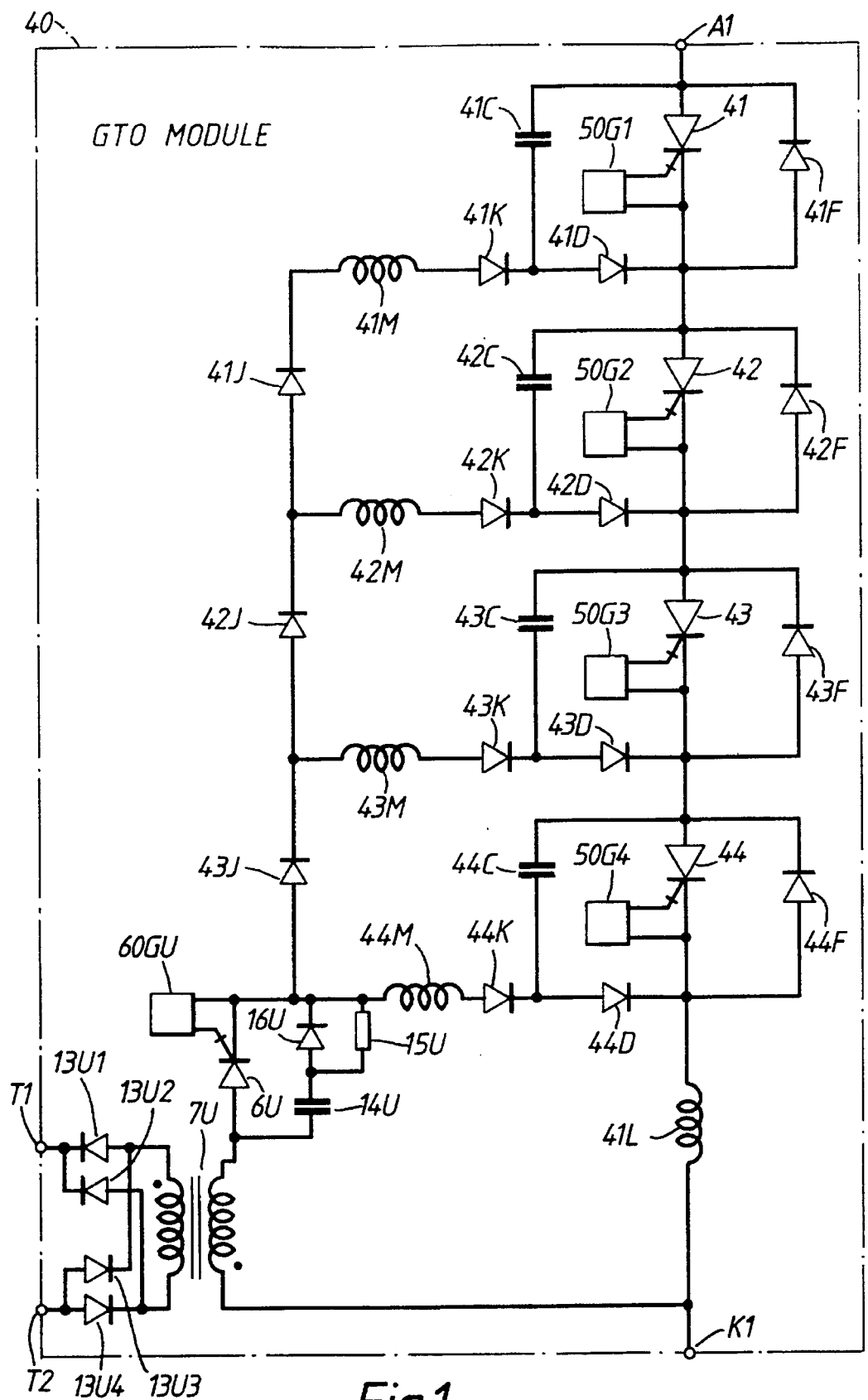
FIG. 1 is a circuit diagram of a GTO module according to a first embodiment of this invention.

Referring now to the drawings, wherein like reference numerals designate identical or corresponding parts throughout the several views, the embodiments of this invention will be described below.

FIG. 1 is a circuit diagram of a first embodiment of this invention, and illustrates the circuit diagram of GTO module 40, corresponding to one phase of a power conversion device, constituted by series connection of a plurality of GTOs 41, 42, 43 and 44 (four in the Figure). Auxiliary circuits such as voltage-dividing resistors provided at both terminals of GTO, a voltage monitoring circuit, and an over-voltage protection circuit are not shown.

In FIG. 1, a terminal A1 is connected to the anode of GTO module 40, a terminal K1 is connected to the cathode of GTO module 40, and terminals T1 and T2 are connected to the DC main circuit to regenerate the snubber energy.

GTO module 40 is constituted by series connected GTOs 41 to 44, feedback diodes 41F to 44F, snubber circuits, gate circuits 50G1 to 50G4 and a snubber energy regenerating circuit. The snubber circuits are constituted of series circuits of snubber capacitors 41C to 44C and snubber diodes 41D to 44D, respectively. When a steep voltage (dv/dt) is applied in the forwards direction to GTOs 41 to 44, buffering is effected by the series circuits consisting of snubber capacitors 41C to 44C and snubber diodes 41D to 44D, respectively.

The snubber energy regenerating circuit regenerates the snubber energy to the DC main circuit. That is, the snubber energy regenerating circuit consists of a circuit that, when GTOs 41 to 44 are turned ON, regenerates the snubber energy to the DC main circuit through anode reactor 41L, the primary winding of a regenerating transformer 7U, an auxiliary switch 6U, diodes 41J to 43J, balance reactors 41M to 44M, and diodes 41K to 44K. Diodes 41K to 44K are provided to prevent circulatory currents being produced by the differences of charging voltages between snubber capacitors 41C to 44C. The snubber energy regenerating circuit further consists of a circuit that the secondary winding current of regenerating transformer 7U is rectified by diodes 13U1 to 13U4, and after this, the rectified output of this secondary winding is connected through terminal T1 and terminal T2 to the DC main circuit.

Although any self-turn-off device could be used for auxiliary switch 6U, here we shall describe an example in which it is a GTO. In the snubber energy regenerating circuit, auxiliary switch 6U is equipped with a snubber capacitor 14U, a snubber diode 16U, a snubber resistor 15U and a gate circuit 60 GU.

Figure 2:
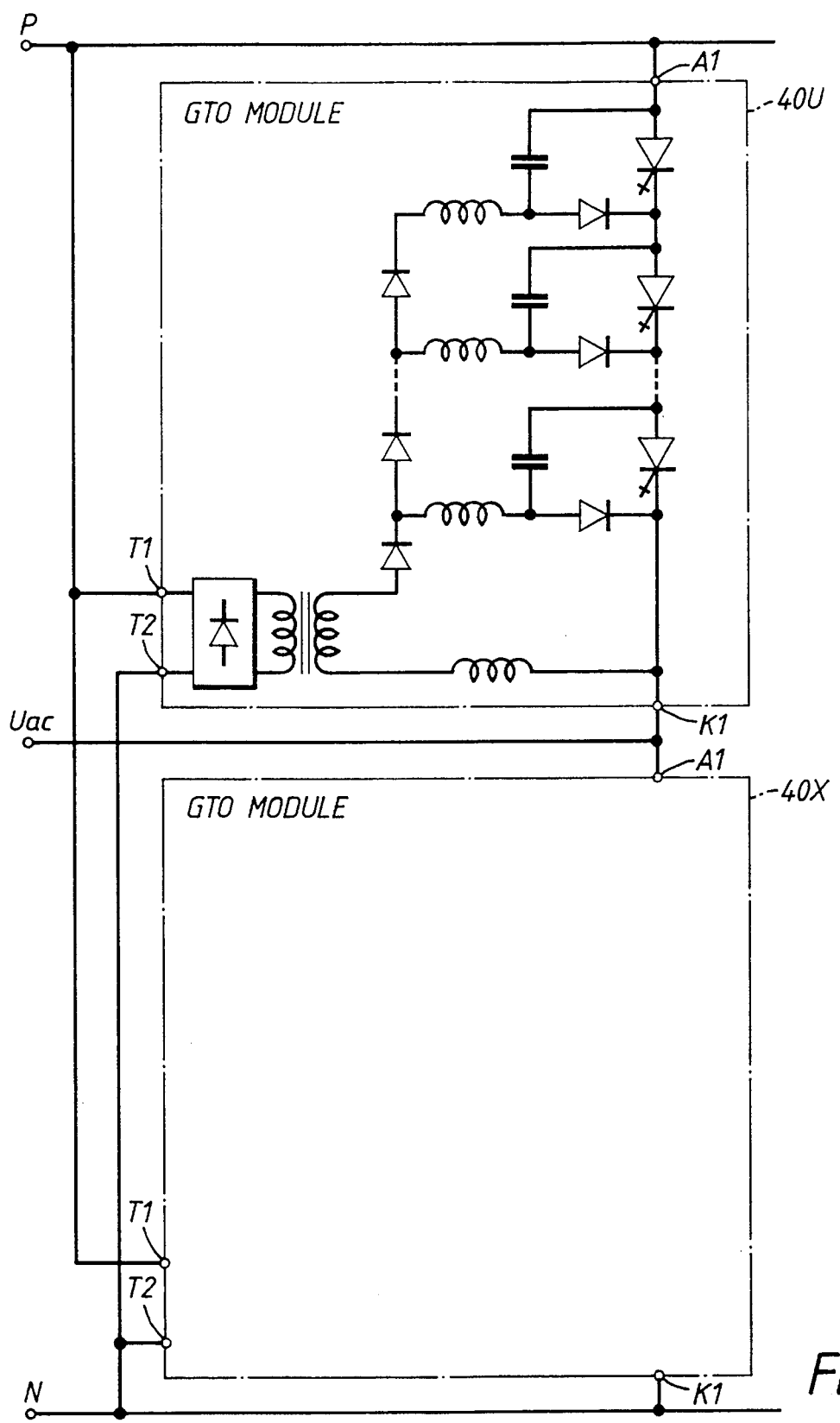
FIG. 2 is a circuit diagram of a part of a power conversion device constructed with the GTO modules shown in FIG. 1.

A power conversion device can be provided by connecting GTO modules 40 constructed in this way as a three-phase bridge circuit. FIG. 2 shows the layout of part of the positive arm and negative arm of such a power conversion device.

In FIG. 2, for example, a GTO module 40U corresponds to the U phase and a GTO module 40X corresponds to the X phase. Terminal P is the anode of the DC main circuit, terminal N is the cathode of the DC main circuit, and AC output is taken from a terminal Uac.

Here, each of GTO modules 40U and 40X has the same construction as GTO module 40.

Next, the specific operation of this embodiment will be described with reference to FIG. 1 to FIG. 3. In FIG. 3, the timing chart and the circuitry that is actuated at that point are shown by continuous lines, and the circuitry that is not actuated are shown by broken lines.

Now, at a time point t1, as shown in FIG. 3(b), when an ON gate signal is applied to auxiliary switch 6U, auxiliary switch 6U is turned ON through GTOs 41 to 44 which were turned ON at a time point slightly before time point t1, and the system (power conversion device) enters into an operating module (1) (discharge mode). That is in the equivalent circuit indicated in operating mode (1) (discharge mode), the charges accumulated by snubber capacitors 41C to 44C are discharged by a parallel closed circuit consisting of GTOs 41 to 44, anode reactor 41L, primary winding of regenerating transformer 7U, auxiliary switch 6U, diodes 41J to 43J, balance reactors 41M to 44M, and diodes 41K to 44K, as shown in the drawing. Diodes 41K to 44K are required in order to prevent circulatory interference due to potential differences between parallel circuits in this mode.

Next, when the residual voltages of snubber capacitors 41C to 44C are discharged to values slightly lower than the diode drops of snubber diodes 41D to 44D, respectively, at a time point t2, the system goes into operating mode (2) (circulation mode). That is, snubber diodes 41D to 44D are turned ON, and the energies of snubber capacitors 41C to 44C that have shifted to anode reactor 41L and balance reactors 41M to 44M are returned as shown in FIG. 3 through snubber diodes 41D to 44D. In these operating mode (1) and operating mode (2), the snubber energy is recovered to the DC main circuit through regenerating transformer 7U and gradually decays, the currents flowing through balance reactors 41M and 44M becoming 0 at a time point t3. After waiting for a short time, auxiliary switch 6U is turned off, and operating mode (2) is completed. When a turn-off gate signal is applied to GTO module 40U as shown in FIG. 3(a) at a time point t4, the system goes into operating mode (3) (turn-off mode). That is, GTOs 41 to 44 are turned off, snubber capacitors 41C to 44C are charged up in a short time, and at a time point t5 operating mode (3) is terminated.

Subsequently in the same way, by repeating operating mode (1) to operating mode (3) during the period of one cycle, the energy of the snubber capacitors 41C to 44C employed for GTOs 41 to 44 is regenerated to the DC main circuit through regenerating transformer 7U.

Figure 4:
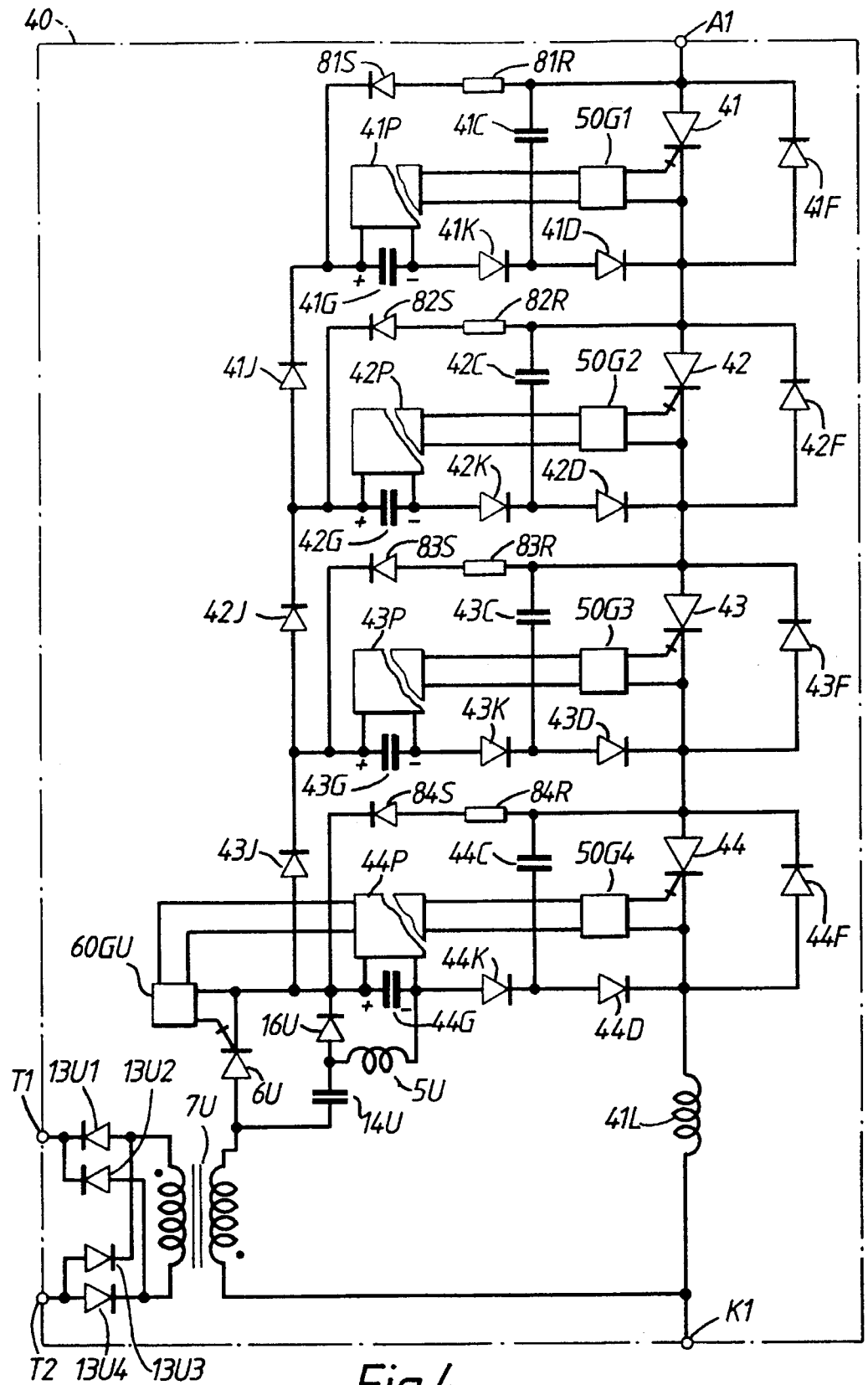
FIG. 4 is a circuit diagram of a GTO module according to a second embodiment of this invention.

FIG. 4 is a circuit diagram of a second embodiment of this invention. The point of difference between this embodiment and the first embodiment of FIG. 1 is that, instead of balance reactors 41M to 44M of the snubber energy regenerating circuit of FIG. 1 the following circuits are provided. That is, there are provided gate power source capacitors 41G to 44G, initial charging circuits composed of series circuit of initial charging resistors 81R to 84R and diodes 81S to 84S, respectively, DC/DC converters 41P to 44P, and a reactor 5U. Parts of the snubber energies of GTOs 41 to 44 are utilized as gate power sources by means of DC/DC converters 41P to 44P, and the snubber energy of auxiliary switch 6U also can be regenerated to the gate power source. Other aspects of this embodiment are the same as the embodiment of FIG. 1, so the same reference symbols are applied to the same parts and further description thereof is omitted.

Figure 5:
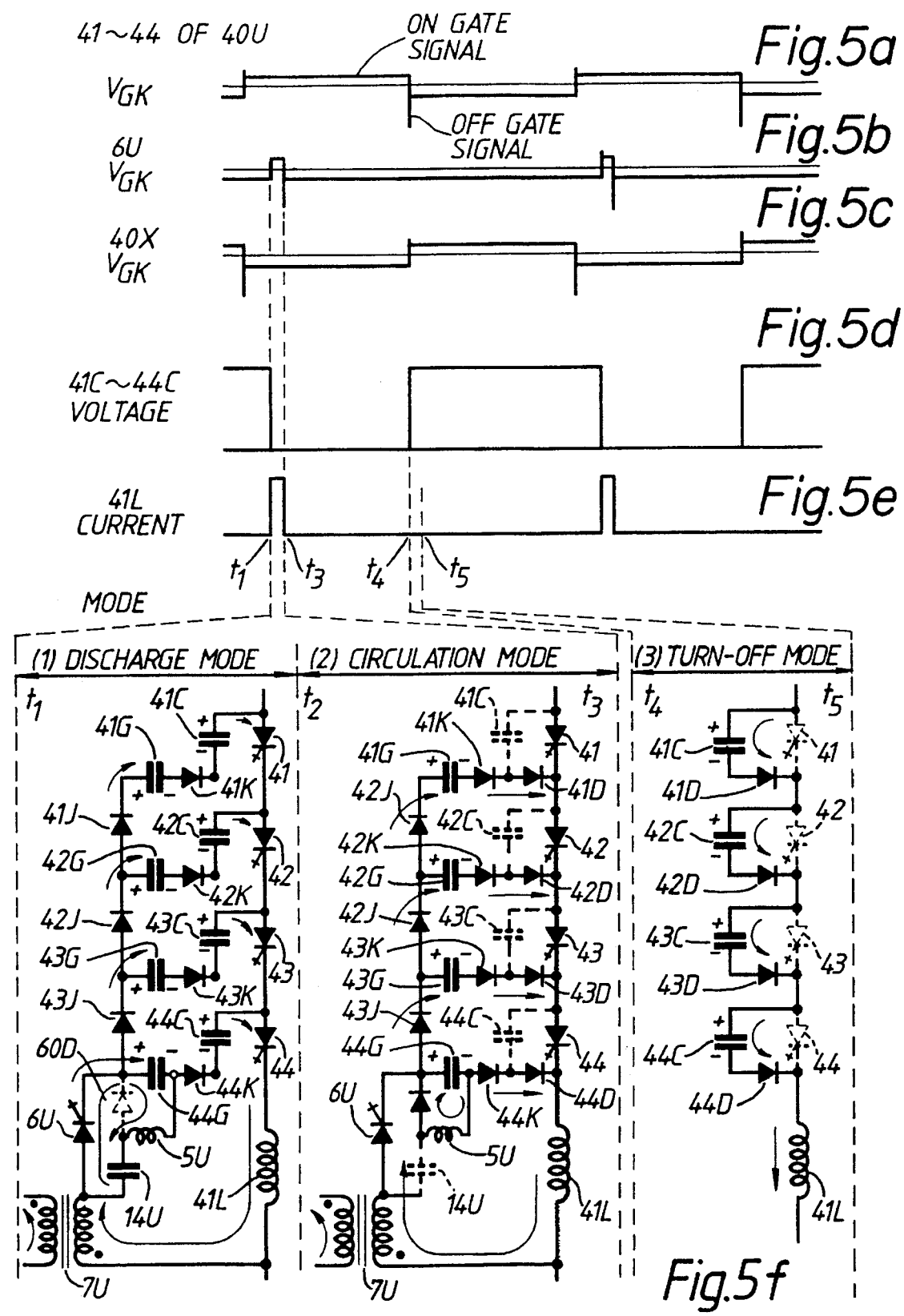
FIG. 5 is a view given in explanation of the operation of the GTO module shown in FIG. 4.

Next, details of the operation of this embodiment will be described with reference to FIG. 4 and FIG. 5. In FIG. 5, the timing chart and the circuitry that is actuated at that time are shown by continuous lines; the circuitry that is not actuated is indicated by broken lines. Description of parts which are the same as those of FIG. 3 which have already been described is omitted. Furthermore, parts of operating mode 1 (discharge mode) to operating mode 3 (turn-off mode) of this embodiment are the same as those in FIG. 3, so description of these is omitted to avoid repetition.

Now, as shown in FIG. 5(a), after waiting a short time from a time point t0 at which the ON gate signal is supplied to GTO module 40U, the system goes into operating mode (1) (discharge mode) when an ON signal is supplied to auxiliary switch 6U at time point t1. Thereupon, the charge accumulated on snubber capacitor 14U of auxiliary switch 6U is discharged by the closed loop: snubber capacitor 14U auxiliary switch 6U—gate power source capacitor 44G—reactor 5U—snubber capacitor 14U, so that this charge is recovered on to gate power source capacitor 44G. At time point t2, the system goes into operating mode (2) (circulation mode) when the residual voltages of snubber capacitors 41C to 44C are discharged to values slightly lower than the diode drops of snubber diodes 41D to 44D, respectively. In operating mode (2), the snubber energy that has shifted to anode reactor 41L is regenerated to the DC main circuit through regenerating transformer 7U and is further regenerated to gate power source capacitors 41G to 44G, where it gradually decays, the excitation current of regenerating transformer 7U is also absorbed and, after the magnetic flux thereof is reset the current becomes zero at time point t3, whereupon this operating mode (2) is terminated. In this operating mode (2), the current of reactor 5U on to which the snubber energy of auxiliary switch 6U has shifted is also regenerated to capacitor 44G, so the snubber loss of auxiliary switch 6U can be decreased. At time point t4, as shown in FIG. 5(a), operating mode (3) (turn-off mode) is started by applying an OFF gate signal to GTO module 40U, allowing snubber capacitors 41C to 44C to be charged up for a short time up to time point t5, whereupon operating mode (3) terminates.

Thus, in this embodiment, the snubber energy used for GTOs 41 to 44 and auxiliary switch 6U of the snubber energy regenerating circuit can be regenerated to the DC main circuit and gate power source by repeating operating mode (1) to operating mode (3) within the period of one cycle. With the circuit of this embodiment, snubber loss of GTOs 41 to 44 can be decreased, and the snubber energy of auxiliary switch 6U of the snubber energy regenerating circuit can also likewise be regenerated.

Figure 6:
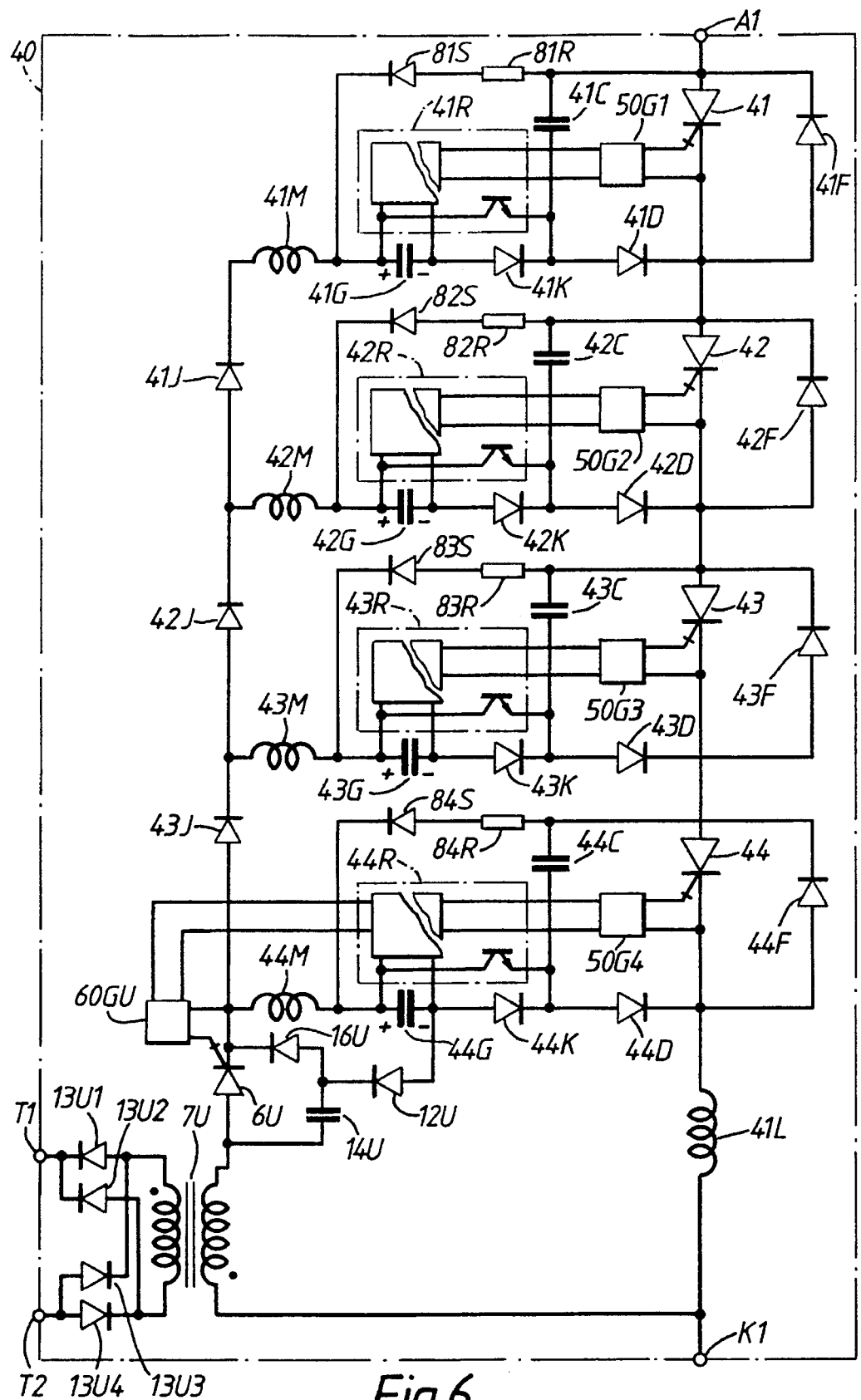
FIG. 6 is a circuit diagram of a GTO module according to a third embodiment of this invention.

FIG. 6 is a circuit diagram of a third embodiment of this invention. The respect in which this embodiment differs from the second embodiment of FIG. 4 is that a part of the snubber energy of auxiliary switch 6U is also regenerated to the DC main circuit by employing DC/DC converters 41R to 44R that bypass the excess powers instead of DC/DC converters 41P to 44P. In other respects, it is the same as the embodiment of FIG. 4, and identical parts are given the same reference symbols and further description thereof is omitted.

Figure 7:
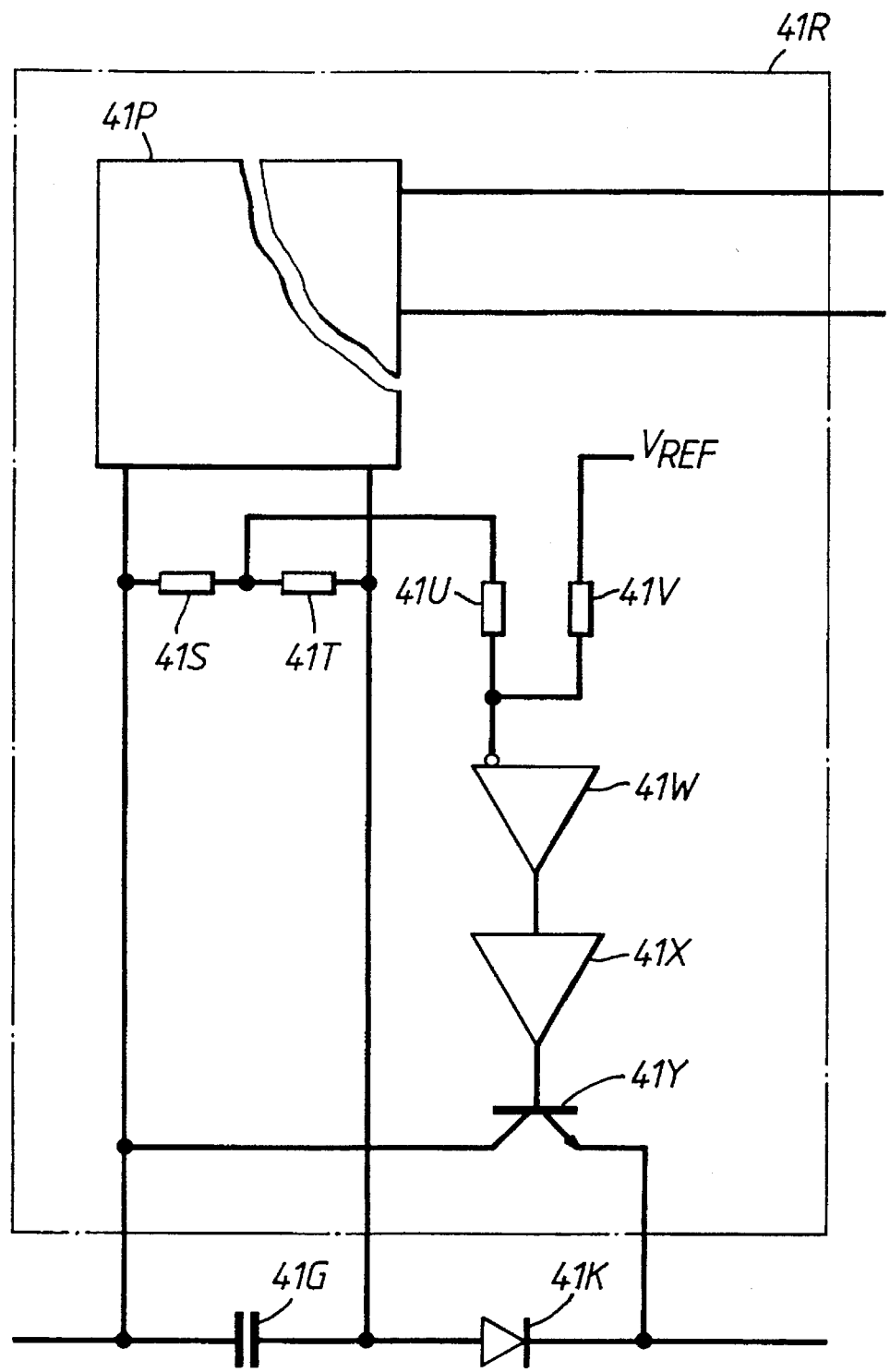
FIG. 7 is a circuit diagram of the DC/DC converter shown in FIG. 6.

FIG. 7 shows an example of the detailed circuitry of DC/DC converter 41R employed in this embodiment. As shown in this Figure, the voltage of gate power source capacitor 41G is subjected to voltage division by resistors 41S and 1T. The feedback voltage value detected through a feedback resistor 41U is compared by a comparator 41W with a reference voltage VREF through a resistor 41V. If the feedback voltage exceeds reference voltage VREF, the charging current of capacitor 41G is bypassed by turning on a switch 41Y through a buffer circuit 41X. At this point, the voltage of capacitor 41G is applied as a reverse voltage to diode 41K, so conduction of diode 41K is prevented. The circuitry of each of DC/DC converters 42R, 43R and 44R is the same as that of DC/DC converter 41R, so the description thereof is omitted.

In this embodiment, thanks to the use of such DC/DC converters 41R to 44R, excess power is not generated in the gate power source, so the snubber energy except the necessary gate power can all be regenerated to the main circuit through regenerating transformer 7U, thereby enabling the regenerating efficiency to be raised.

The rest of the operation of this embodiment is the same as that shown in the timing chart of FIG. 5 which describes the operation of the embodiment of FIG. 4, and further description thereof is therefore omitted. Like the embodiment of FIG. 4, the circuit of this embodiment can also reduce snubber loss of GTOs 41 to 44, and the snubber energy of auxiliary switch 6U of the snubber energy regenerating circuit can likewise be regenerated.

In the first to third embodiments described above, examples were illustrated based on a circuit wherein regeneration is effected by recovering the energy of anode reactor 41L by snubber capacitors within the GOT module 40.

However, it would also be possible in this invention to provide separately a recovery circuit whereby the energy of anode reactor 41L is recovered.

Figure 8:
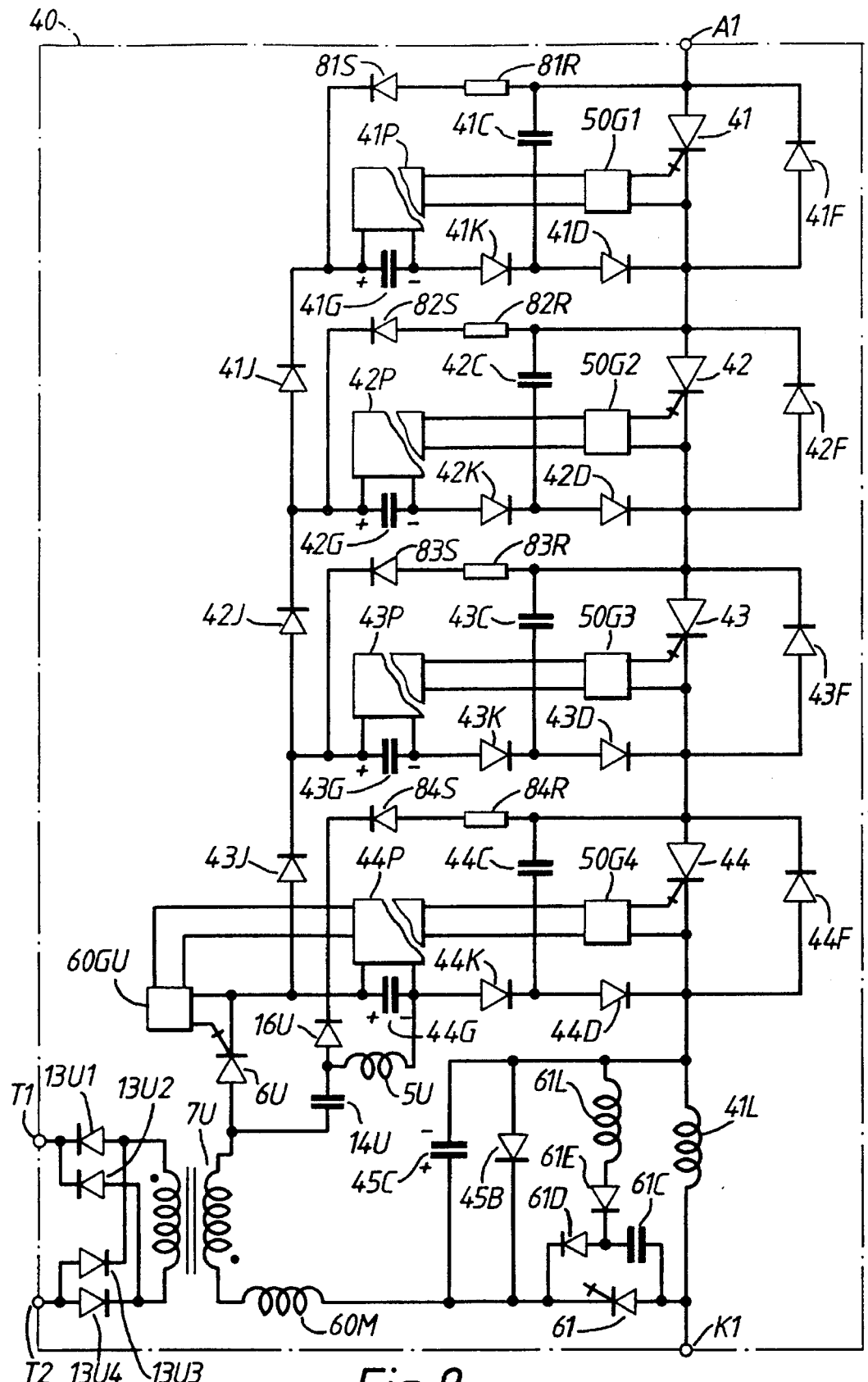
FIG. 8 is a circuit diagram of a GTO module according to a fourth embodiment of this invention.

FIG. 8 is a circuit diagram of a fourth embodiment of this invention. The respect in which this embodiment differs from the embodiment of FIG. 4 is as follows. That is, the energy accumulated in anode reactor 41L is recovered temporarily to a capacitor 45C through an auxiliary switch 61 when GTOs 41 to 44 are turned off. By turning auxiliary switch 6U ON when the snubber energy regenerating circuit is actuated, a discharge path of capacitor 45C is formed, so that the snubber energy of snubber capacitors 41C to 44C and the energy of anode reactor 41L are regenerated. Also, the energy of the snubber circuit of auxiliary switch 61 constituted by the a snubber capacitor 61C and a snubber diode 61D can be regenerated to capacitor 45C through a reactor 61L and a diode 61E when auxiliary switch 61 is turned ON. Furthermore, a diode 45B and a reactor 60M are provided. In other respects, this embodiment is the same as that of FIG. 4, so identical parts are given the same reference symbols and further description is omitted.

Figure 9:
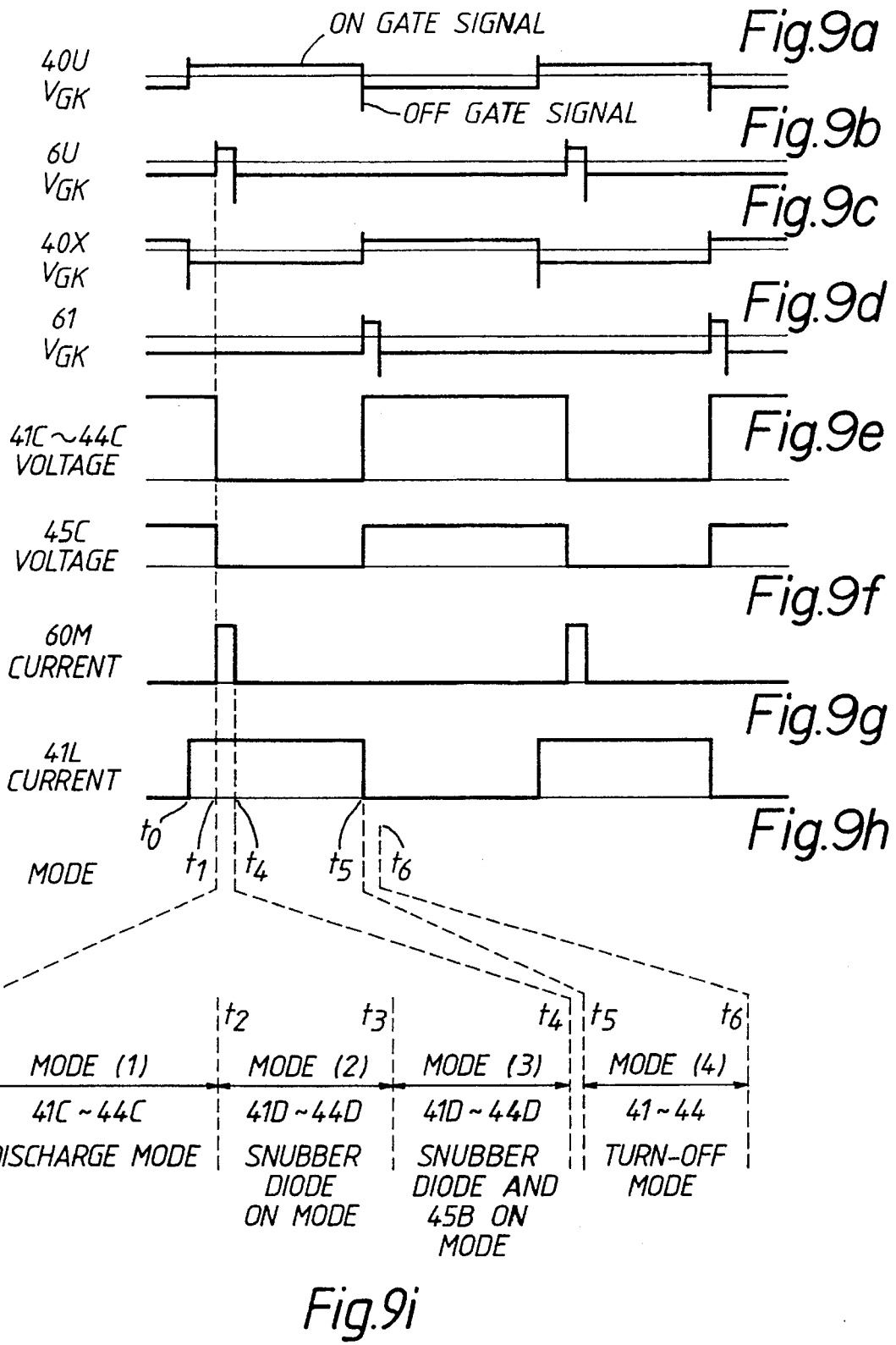
FIG. 9 is a view given in explanation of the operation of the GTO module shown in FIG. 8.
Figure 10:
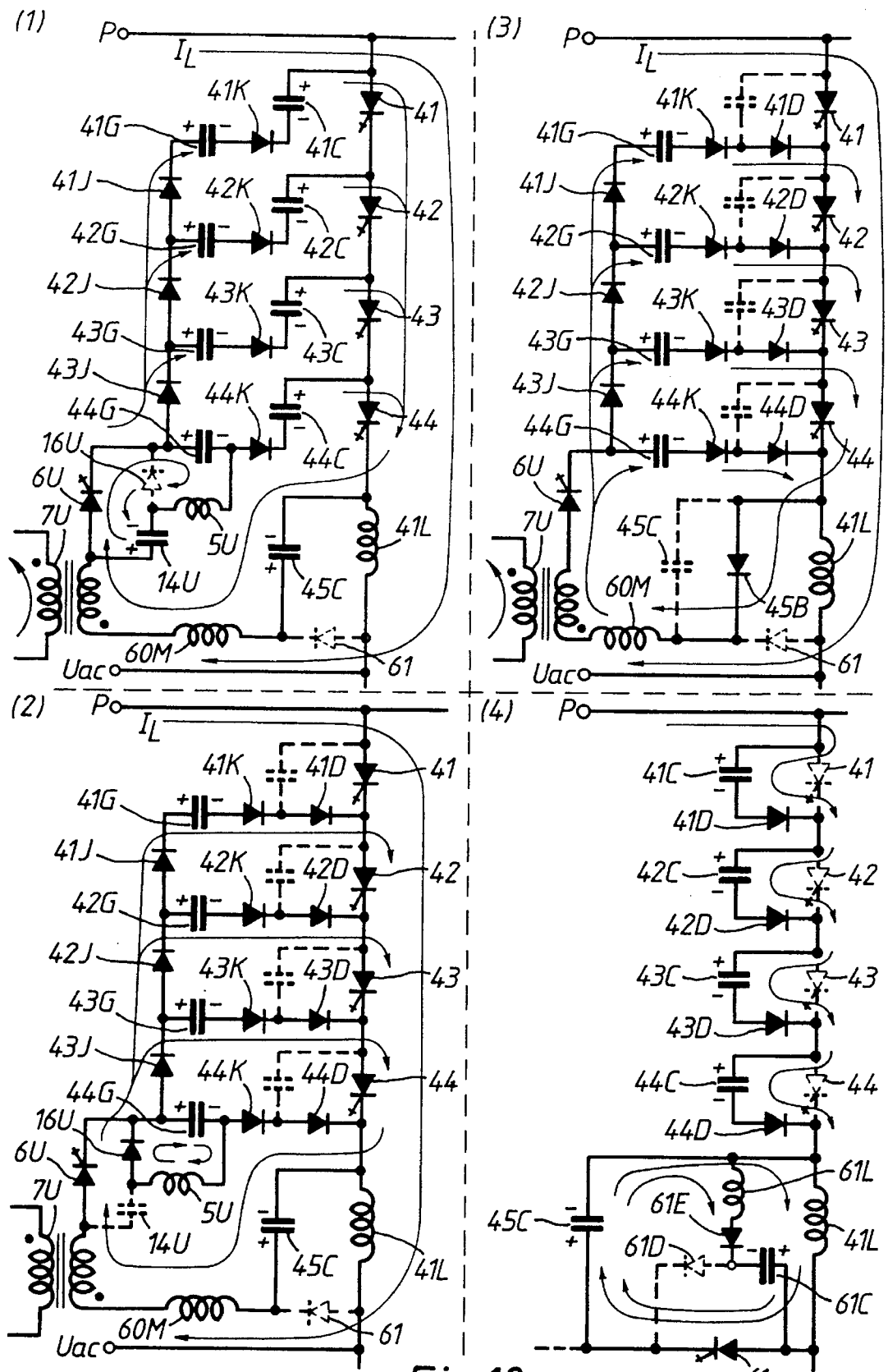
FIG. 10 is an equivalent circuit given in explanation of the operating modes shown in FIG. 9.

Next, the details of the operation of this embodiment will be described with reference to the circuit diagrams of FIG. 2 and FIG. 8, the operating time chart of FIG. 9, and the equivalent circuit diagram of FIG. 10 given in explanation of the operating modes.

In FIG. 9, (a) shows a gate-cathode voltage signal of GTO module 40U; (b) shows a gate-cathode voltage signal of auxiliary switch 6U; (C) shows a gate-cathode voltage signal of GTO module 40X; (d) shows a gate-cathode voltage signal of auxiliary switch 61; (e) shows voltages of snubber capacitors 41C to 44C; (f) shows a voltage of capacitor 45C; (g) shows a current of reactor 60M; (h) shows a current of anode reactor 41L; and (i) shows the operating modes (1) to (4). FIG. 10 shows the equivalent circuit (1) to (4) in the operating modes (1) to (4) of FIG. 9, respectively.

Let us now assume that there are initial voltages as shown in FIG. 9(e) and FIG. 9(f) on snubber capacitors 41C to 44C and anode reactor energy recovery capacitor 45C due to the cyclic action prior to time point t0. As shown in FIG. 9(a), when at time point t0 an ON gate signal is applied to GTO module 40U, a load current flows to GTO module 40U through anode reactor 41L, as shown in (h). When, after a short time, at time point t1 an ON gate signal is applied to auxiliary switch 6U as shown in (b), the system goes in an operating mode (1), in which the voltages of snubber capacitors 41C to 44C are discharged as shown in (e), the voltage of capacitor 45C is discharged as shown in (f), and a discharge current flows to reactor 60M as shown in (g).

In operating mode (1), as shown in FIG. 10(1) the charges of snubber capacitors 41C to 44C are discharged by the respective parallel closed circuits consisting of: GTOs 41 to 44, capacitor 45C, reactor 60M, primary winding of regenerating transformer 7U, auxiliary switch 6U, diodes 41J to 43J, gate power source capacitors 41G to 44G, and diodes 41K to 44K, and are regenerated to the DC main circuit and gate power source. Concurrently, the charge of snubber capacitor 14U of auxiliary switch 6U is discharged by the closed circuit: snubber capacitor 14U—auxiliary switch 6U—gate power source capacitor 44G—reactor 5U—snubber capacitor 14U, and is regenerated to the gate power source. When, at time point t2, the residual voltages of snubber capacitors 41C to 44C are discharged to values slightly lower than the diode drops of the respective snubber diodes 41D to 44D, snubber diodes 41D to 44D are turned ON, with the result that the system goes into the snubber diode ON mode (2) of FIG. 10, and circulation occurs through snubber diodes 41D to 44D. Thus, the voltage of capacitor 45C is discharged in the discharge mode (1) and snubber diode ON mode (2). This is because recirculation to anode reactor 41L is cut off by auxiliary switch 61 as shown by the broken lines in FIG. 10(1) and FIG. 10(2). Furthermore, when the residual voltage of capacitor 45C is discharged to a value slightly lower than the diode drop of diode 45B at time point t3, diode 45B is turned ON, allowing the snubber energy that has shifted to reactor 60M and the anode reactor energy to circulate through diode 45B, resulting in the circulation mode (3) of FIG. 10.

Thus, during operating mode (1) to operating mode (3), the charges of snubber capacitors 41C to 44C which are present as initial values in the cycle-period operation prior to time point t0 and the charge of capacitor 45C that stored the energy of the anode reactor are regenerated as follows. That is one part thereof is regenerated to the DC main circuit through regenerating transformer 7U, while the rest is regenerated to the respective gate power source capacitors 41G to 44G. Due to the regeneration action, the charge decays gradually. The excitation current of regenerating transformer 7U also decays and an action of resetting the magnetic flux thereof also takes place at the same time. After this, the current becomes zero at time point t4, and operating mode (3) is thereby completed. Subsequently, when an OFF gate signal is applied to GTO module 40U as shown in FIG. 9(a) at time point t5, the system goes into the turn-off mode (4), in which GTOs 41 to 44 are turned OFF as in mode (4) of FIG. 10. Snubber capacitors 41C to 44C are charged up within a short space of time. Concurrently, an ON gate signal is applied to auxiliary switch 61 as shown in FIG. 9(d) causing auxiliary switch 61 to turn ON; this allows the energy of anode reactor 41L to be charged on capacitor 45C. Turn-off mode (4) is thereby completed at time point t6. Simultaneously, the charge stored on snubber capacitor 61C of auxiliary switch 61 is discharged through the closed circuit: snubber capacitor 61C—auxiliary switch 61—capacitor 45C—reactor 61L—diode 61E—snubber capacitor 61C and is thereby recovered to capacitor 45C.

Subsequently in the same way, by repeating operating modes (1) to (4) in a single cycle-period, of the energy of the snubber capacitors 41C to 44C employed in the plurality of GTOs 41 to 44 and the energy of anode reactor 41L, a part is regenerated to the DC main circuit through regenerating transformer 7U, while the rest is allocated to the respective GTO gate power sources 41G to 44G. Concurrently, the magnetic flux of regenerating transformer 7U is reset, enabling transformer saturation to be reliably prevented.

Figure 11:
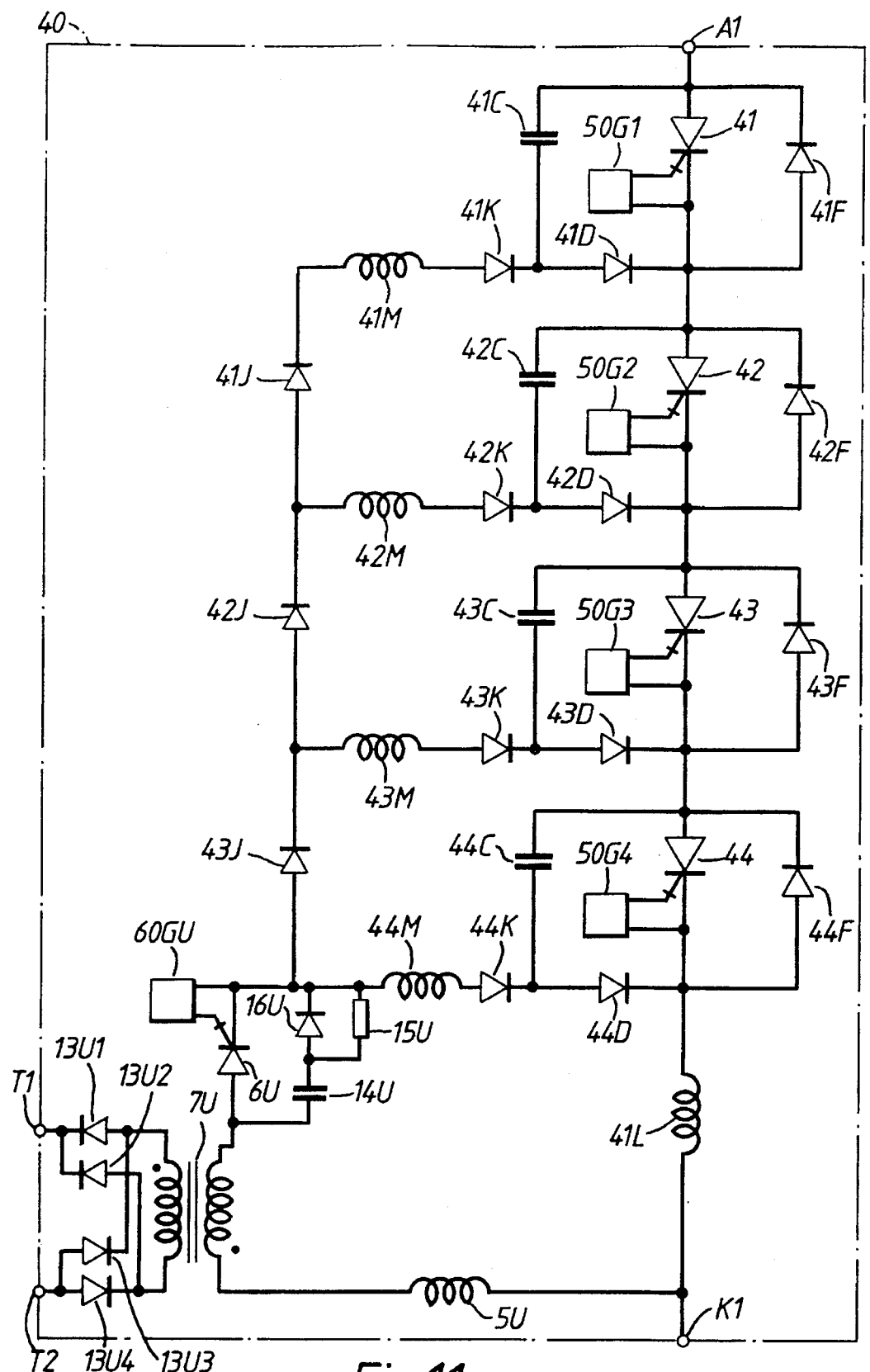
FIG. 11 is a circuit diagram of a GTO module according to a fifth embodiment of this invention.

FIG. 11 is a circuit diagram of a fifth embodiment of this invention. The sole point of difference from the embodiment of FIG. 1 is that, in this embodiment, a reactor U is now added. Other respects are the same as the embodiment of FIG. 1, so the same reference symbols are employed for the same items and further description is omitted.

In this embodiment, there are separately provided small-inductance reactors 41M to 44M to balance the respective regeneration currents of GTOs 41 to 44 and large-inductance reactor 5U in order to restrict the overall value of the regeneration current.

Figure 12:
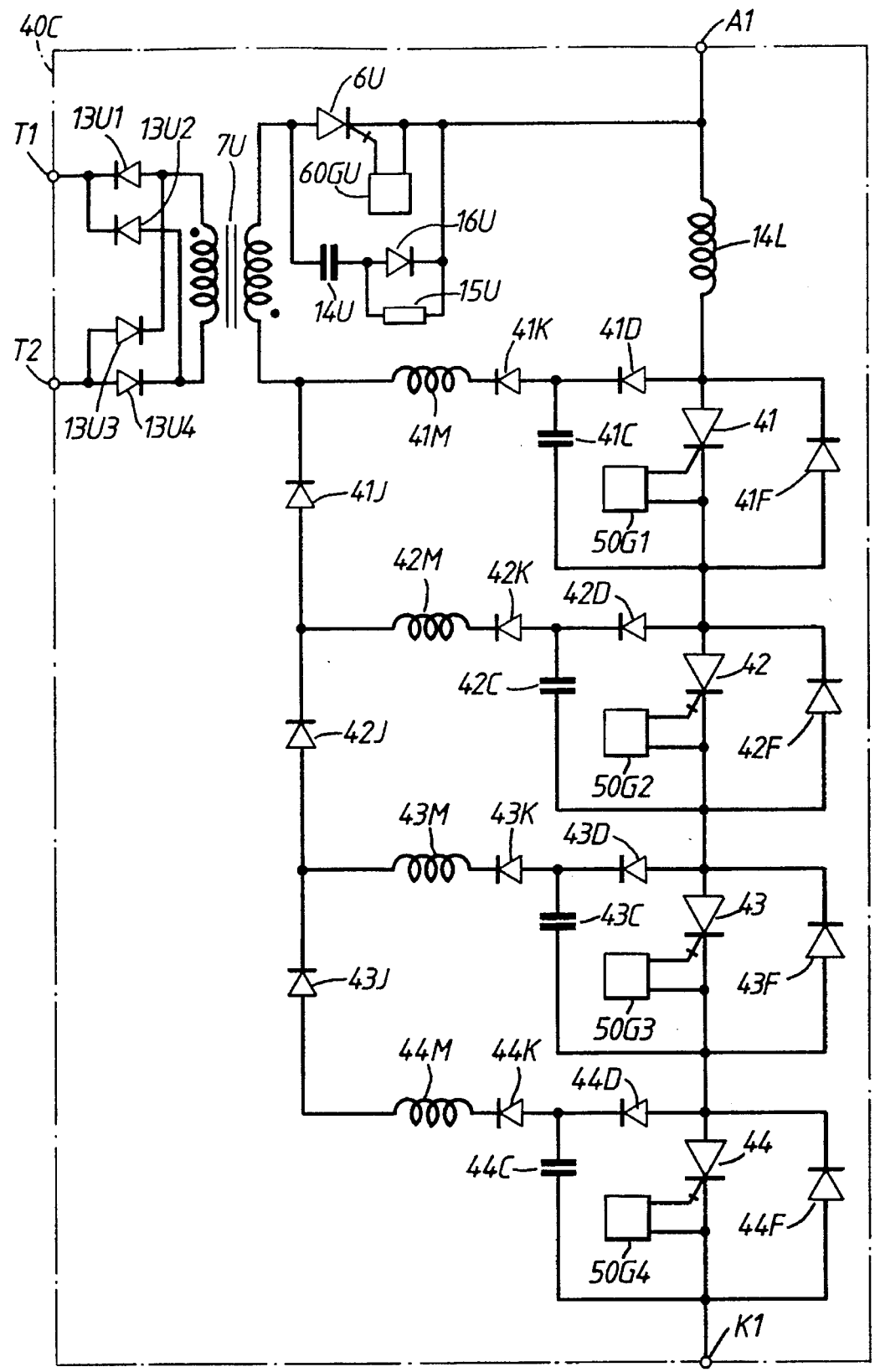
FIG. 12 is a circuit diagram of a GTO module according to a sixth embodiment of this invention.

FIG. 12 is a circuit diagram of a sixth embodiment of this invention. The respect in which this embodiment differs from the embodiment of FIG. 1 is that the connections between snubber capacitors 41C to 44C and snubber diodes 41D to 44D are oppositely arranged, respectively, and anode reactor 41L and the snubber energy regenerating circuit are arranged on the positive potential side of an entire GTO module 40C. This embodiment operates in the same way as the embodiment of FIG. 1, so further description thereof is omitted.

Figure 13:
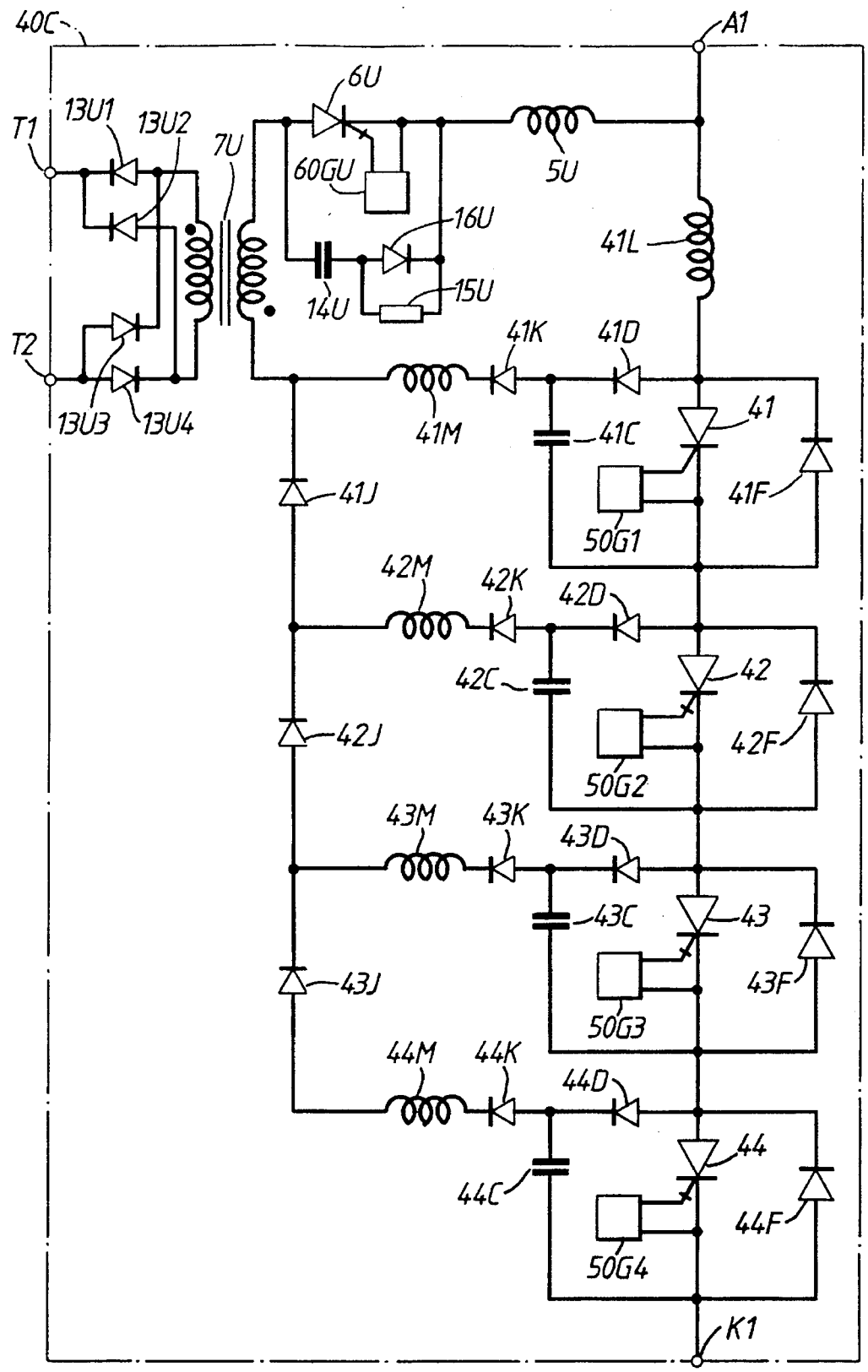
FIG. 13 is a circuit diagram of a GTO module according to a seventh embodiment of this invention.

FIG. 13 is a circuit diagram of a seventh embodiment of this invention. The respect in which this embodiment differs from the embodiment of FIG. 11 is that the connections between snubber capacitors 41C to 44C and snubber diodes 41D to 44D are oppositely arranged, respectively, and anode reactor 41L, reactor 5U and the snubber energy regenerating circuit are arranged on the positive potential side of entire GTO module 40C. Operation is the same as the embodiment of FIG. 11, so further description thereof is omitted.

It may be remarked that this same process of arranging the connections between the snubber diodes and snubber capacitors oppositely, respectively, and arranging the regenerating transformer on the positive potential side, as in the embodiments of FIG. 12 and FIG. 13 described above, could be applied to the embodiments of FIG. 4, FIG. 6 and FIG. 8 too. The operations are the same as in these embodiments described above, so further explanation thereof is omitted.

The various embodiments described above could of course also be applied to the power conversion device using self-turn-off devices other than GTOs, and switching devices other than GTOs could be employed for auxiliary switches 6U and 61. Furthermore, capacitor 41G to 44G for the gate power source could be replaced by secondary cells such as batteries. It is to be noted that the power source, to which the energy is regenerated through regenerating transformer 7U, need not be the DC power source of the main circuit, but could be another power source, so long as it is a power source capable of absorbing regenerated power. Additionally, regenerating transformer 7U could be a regenerating current transformer. Furthermore, since resistors 81R to 84R and diodes 81S to 84S of the initial charging circuits are not involved in the essence of this invention, other circuitry could be employed so long as gate power source capacitors 41G to 44G are capable of being initially charge up.

Figure 14:
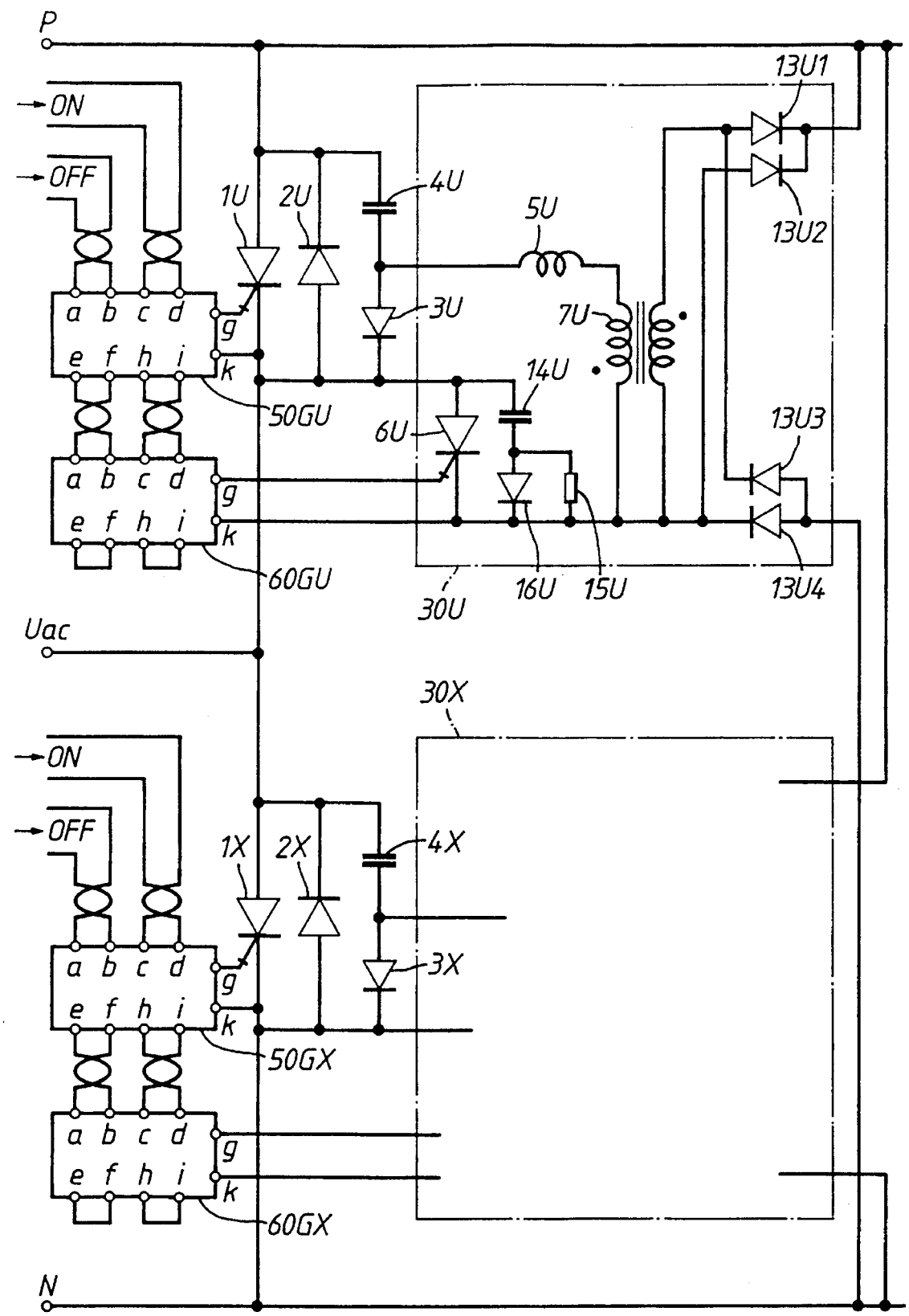
FIG. 14 is a circuit diagram of a part of a power conversion device according to an eighth embodiment of this invention.

FIG. 14 shows an eighth embodiment of this invention. In FIG. 14, the circuitry of one phase of an inverter is depicted. 1U and 1X are self-turn-off devices (in this case assumed to be GTOs), 3U and 3X are snubber diodes, 4U and 4X are snubber capacitors, 2U and 2X are feedback diodes. 30U is a snubber energy regenerating circuit consisting of: first auxiliary switch (in this case assumed to be a GTO) 6U, snubber capacitor 14U, snubber diode 16U, snubber resistor 15U, reactor 5U, regenerating transformer 7U such as a voltage transformer or current transformer, and diodes 13U1 to 13U4. 30X is also a snubber energy regenerating circuit having the same construction as that of snubber energy regenerating circuit 30U.

First gate circuits 50GU and 50GX that perform ON/OFF control of GTOs 1U and 1X are connected in series, respectively, as shown in the drawings, with second gate circuits 60GU and 60GX that perform ON/OFF control of auxiliary GTOs 6U.

Figure 15:
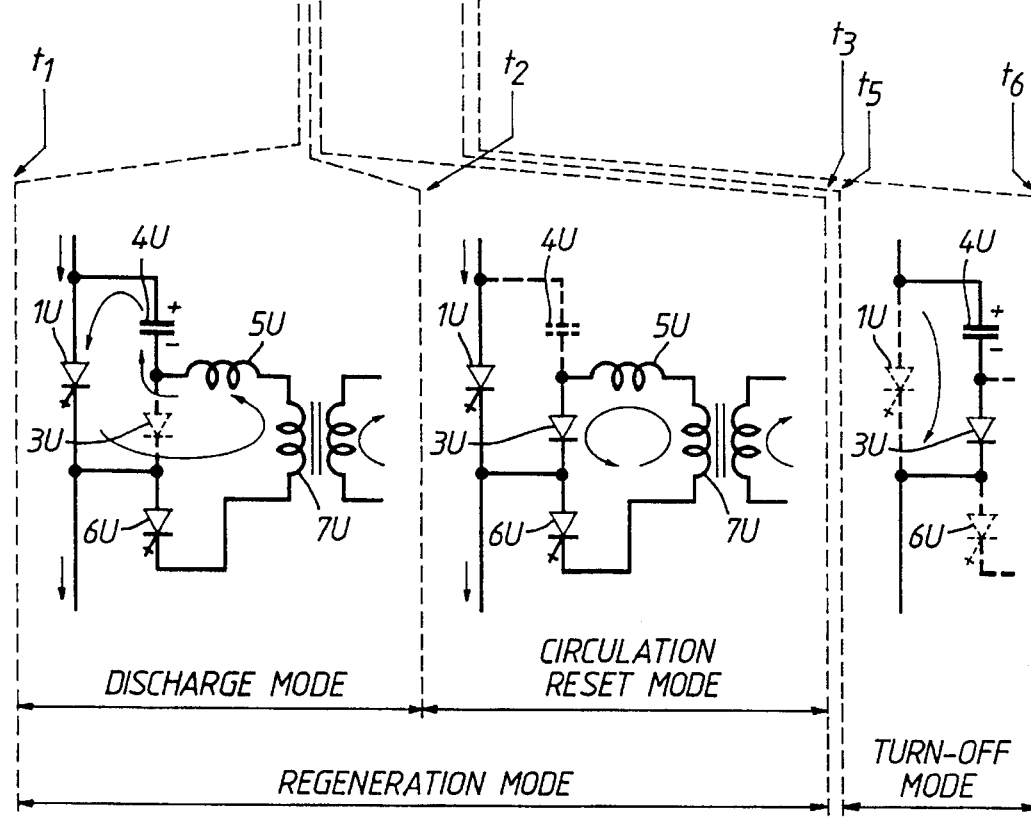
FIG. 15 is a view given in explanation of the operation of the GTO module shown in FIG. 14.

The action of this embodiment will now be described with reference to the operating waveforms of the various units of FIG. 14 shown in FIG. 15. In FIG. 15, (a) shows the gate voltage of GTO 1U, (b) shows the gate voltage of auxiliary GTO 6U, (c) shows the voltage of snubber capacitor 4U, and (d) shows the current of reactor 5U. The time point at which GTO 1U is turned ON is called t0. Prior to time point t0, snubber capacitor 4U is fully charged as shown by (c).

At a time point t1, a short time after time point t0, when auxiliary GTO 6U is turned ON as shown in (b), the charge of snubber capacitor 4U is discharged by the path: snubber capacitor 4U—GTO 1U—auxiliary GTO 6U—the primary winding of transformer 7U—reactor 5U—snubber capacitor 4U: this constitutes the discharge mode. At a time point t2 at which the voltage of snubber capacitor 4U becomes zero, snubber diode 3U is turned ON, allowing the circulation by the path: auxiliary GTO 6U—the primary winding of transformer 7U—reactor 5U—snubber diode 3U—auxiliary GTO 6U: this constitutes the circulation and resetting mode.

Auxiliary GTO 6U turns OFF at a time point t4, which is slightly later than a time point t3 at which the current of reactor 5U decays. The period from time point t1 to time point t3 constitutes the regenerating mode. After the regenerating mode has been completed, GTO 1U turns OFF at a time point t5 after the lapse of a prescribed time period. The period from time point t5 to a time point t6 constitutes the turn-off mode. By means of the above action, the snubber energy is regenerated to the power source side by the regenerating mode during time points t1 to t3 within a single cycle period.

Figure 16:
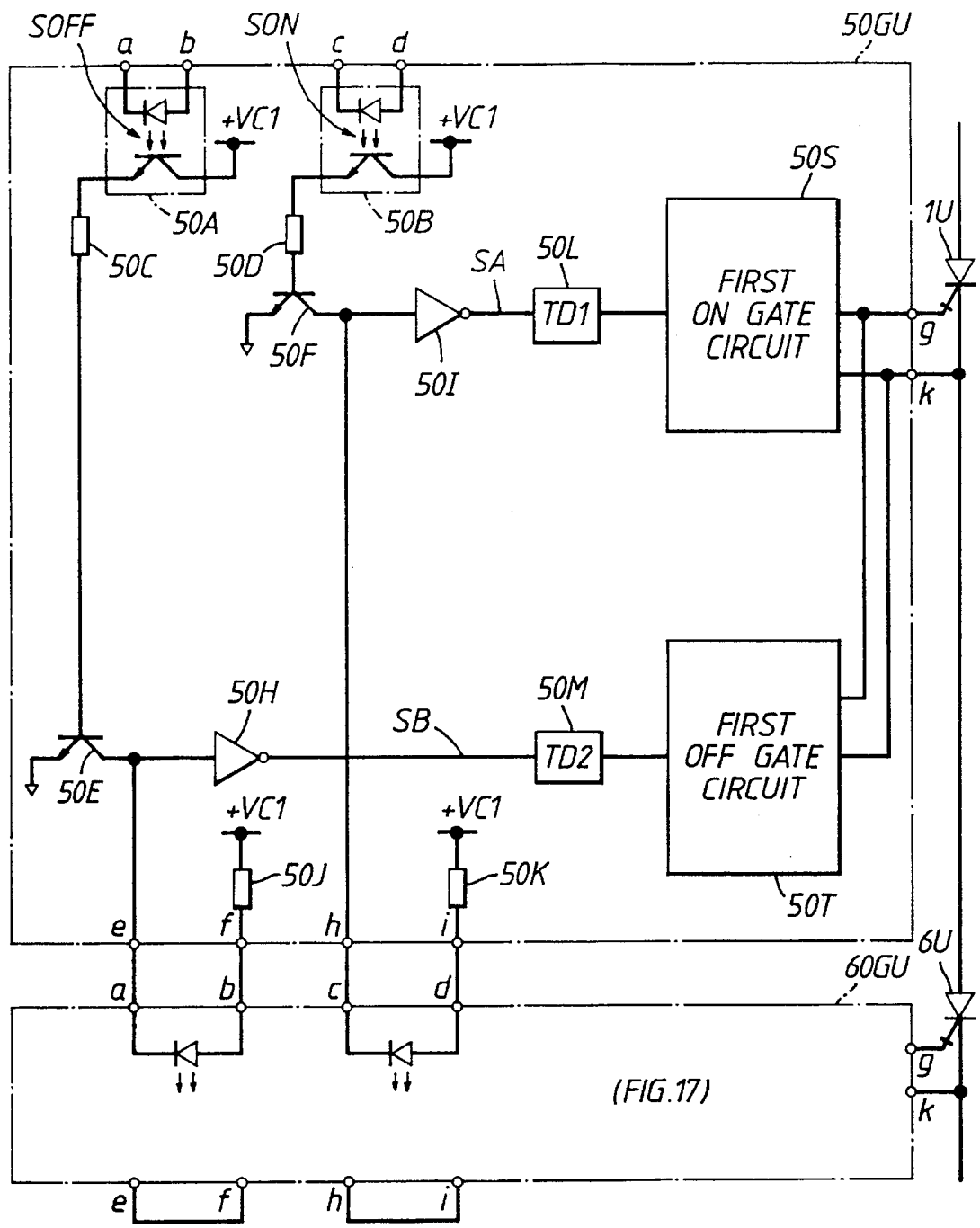
FIG. 16 is a circuit diagram of a first gate circuit of the power conversion device shown in FIG. 14.

The above ON/OFF control will be described in further detail with reference to FIG. 16 to FIG. 21. FIG. 16 is a circuit diagram of first gate circuit 50GU for GTO 1U. An OFF signal SOFF that is input to terminals a, b is insulated by a second photocoupler device 50A and is then used to turn a transistor 50E ON through a resistor 50C. Transistor 50E is connected to a NOT circuit 50H to obtain an OFF signal SB, and concurrently drives a fourth photocoupler device of the next-stage gate circuit from terminals e, f through a resistor 50J. OFF signal SB that is obtained supplies an OFF signal to a first OFF gate circuit 50T through a second time-lag circuit 50M.

Second time-lag circuit 50M is provided with the object of performing adjustment to reduce the variation of turn-off times of a plurality of GTOs connected in series. If the circuit does not have a plurality of GTOs connected in series, second time-lag circuit 50M could be omitted. Likewise, an ON signal SON that is input to terminals c, d, after being insulated through a first photocoupler device 50B, turns a transistor 50F ON through a resistor 50D. Transistor 50F is connected to a NOT circuit 50I to obtain an ON signal SA, and it drives a third photocoupler device of the next-stage gate circuit from terminals g, i through a resistor 50K. ON signal SA that is obtained is arranged to provide an ON signal to a first ON gate circuit 50S through a first time-lag circuit 50L. First time-lag circuit 50L is provided with the object of effecting adjustment so as to reduce the variation of turn-on times of a plurality of GTOs connected in series. If a plurality of GTOs connected in series are not employed, first time-lag circuit 50L could be omitted. The detailed construction of circuits 50S and 50T is not directly related to the gist of this invention and is therefore omitted. The above completes the detailed description of the construction of first gate circuit 50GU for the main GTO.

First gate circuit 50GX is constructed the same as first gate circuit 50GU as described above.

Figure 17:
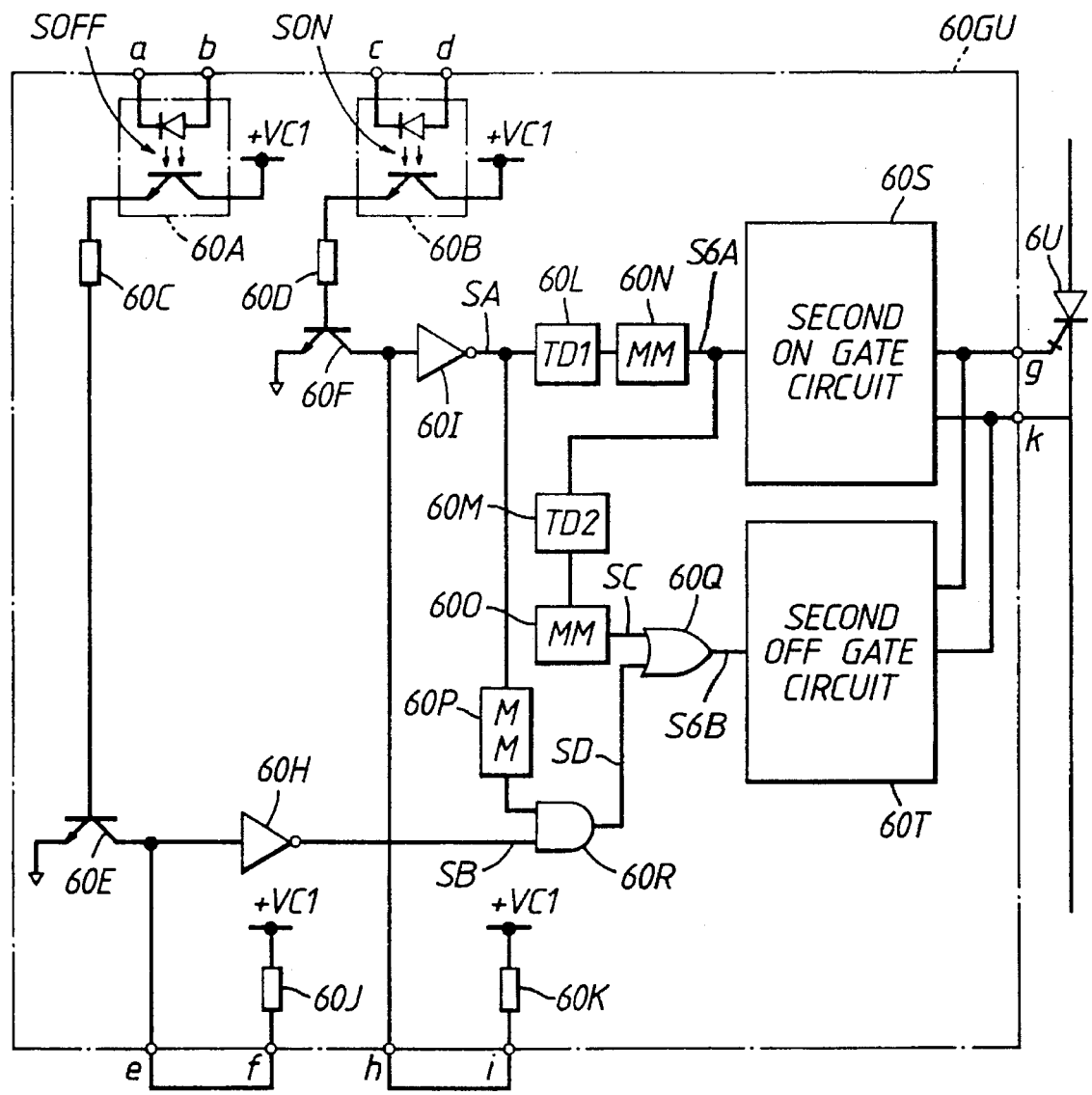
FIG. 17 is a circuit diagram of a second gate circuit of the power conversion device shown in FIG. 14.

Next, the detailed circuit diagram of second gate circuit 60GU of auxiliary GTO 6U shown in FIG. 17 will be described with reference to the timing chart of its operation shown in FIG. 18. In FIG. 17, parts which are the same as or correspond to those of FIG. 16 have their reference numerals changed from 50's to 60's, and further description thereof is omitted. In FIG. 18, (a) shows signal SA, (b) shows signal SB, (c) shows a signal S6A, (d) shows a signal S6B, (e) shows a signal SC and (f) shows a signal SD.

When signal SA obtained as described above in FIG. 16 does to "1" at a time point t11 as shown in FIG. 18(a), after an ON delay of a period Td1 due to the action of a third time-lag circuit 60L, signal S6A of a pulse width TW1 is obtained by a first pulse generating circuit 60N (in this case, a monostable multivibrator circuit). In this way, signal S6A is input to a second ON gate circuit 60S as the ON gate signal of auxiliary GTO 5U of pulse width TW1 from a time point t12 to a time point t13 as shown in FIG. 18(c). Signal SC of a pulse width TW2 is then obtained by a second pulse generating circuit 60O (in this case, a monostable multivibrator circuit) after an ON delay of a period Td2 from time point t13 as shown in FIG. 18(e), by the action of a fourth time-lag circuit 60M.

As signal S6B, signal SC is input to a second OFF gate circuit 60T as an OFF gate signal of auxiliary GTO 6U of pulse width TW2 as shown in FIG. 18(d) through an OR circuit 60Q. Signal SD is input to another input terminal of OR circuit 60Q through an AND circuit 60R. In this way, the ON/OFF control signal of auxiliary GTO 6U can be obtained.

Second gate circuit 60GX is constructed the same as second gate circuit 60GU as described above.

The action of a first interrupt circuit constituted by a third pulse generating circuit 60P (in this case, a monostable multivibrator circuit) and AND circuit 60R and OR circuit 60Q will now be described with reference to FIG. 19. FIG. 19 is a time chart at the commencement of operation. At a time point t10 when operation is commenced, signal SB i.e. the OFF gate signal of main GTO 1U is outputted firstly as shown in FIG. 19(b). Since at this point the other input signal SD of AND circuit 60R is "1" as shown in FIG. 19(f), this signal SB passes through AND circuit 60R and OR circuit 60Q without modification thereby to produce signal S6B as shown in FIG. 19(d), causing auxiliary GTO 6U also to commence output from the OFF gate. Once the main and auxiliary GTOs have commenced operation from the OFF gate, as shown in FIG. 19(f), signal SD generates a "0" pulse of a pulse width TW3 by the action of monostable multivibrator circuit 60P from a time point t11 i.e. from the rise of signal SA: this blocks the passage of signal SB through AND circuit 60R. As described above, there is provided a first interrupt circuit constituted by monostable multivibrator circuit 60P, AND circuit 60R, and OR circuit 60Q arranged such as to output from the OFF gates of the main GTO and auxiliary GTO on start-up by the above-described action.

FIG. 20 is a timing chart at the normal stop operation. This shows that if it is assumed that the circuit is stopped synchronously with signal SB (OFF gate signal of the main GTO) at a time point t14, the stopping will be effected on output of signal S6A (auxiliary GTO ON gate signal) as shown in FIG. 20(c) and then on output of signal S6B (auxiliary GTO OFF gate signal) as shown in FIG. 20(d).

FIG. 21 shows the timing chart at a significant malfunction. On occurrence of a significant malfunction, assuming that signal SB (OFF gate signal of the main GTO) is output at a time point t15 as a result of gate blocking of signal SA (ON gate of main GTO) after guaranteeing the minimum ON width of the main GTO, signal S6A (ON gate signal of the auxiliary GTO) is output with its pulse width guaranteed as shown in FIG. 21(c); next, signal S6B (OFF gate signal of auxiliary GTO) is output as shown in FIG. 21(d), resulting in shut-down.

With the eighth embodiment as described above, gate control of a snubber energy regenerating circuit can be simplified because of the series connection of the ON/OFF control circuit of the main GTO and ON/OFF control circuit of the auxiliary GTO.

Furthermore, the logic circuitry that generates signal S6A and signal S6B from signal SA and signal SB as described above is not restricted to the circuit shown in FIG. 17. Any logical circuitry could be employed provided it enables the same signals S6A (auxiliary GTO ON gate signal) and signal S6B (auxiliary GTO OFF gate signal) to be obtained for the period from start-up up to shut-down or significant malfunction shut-down as shown in FIGS. 18 to 21.

Figure 22:
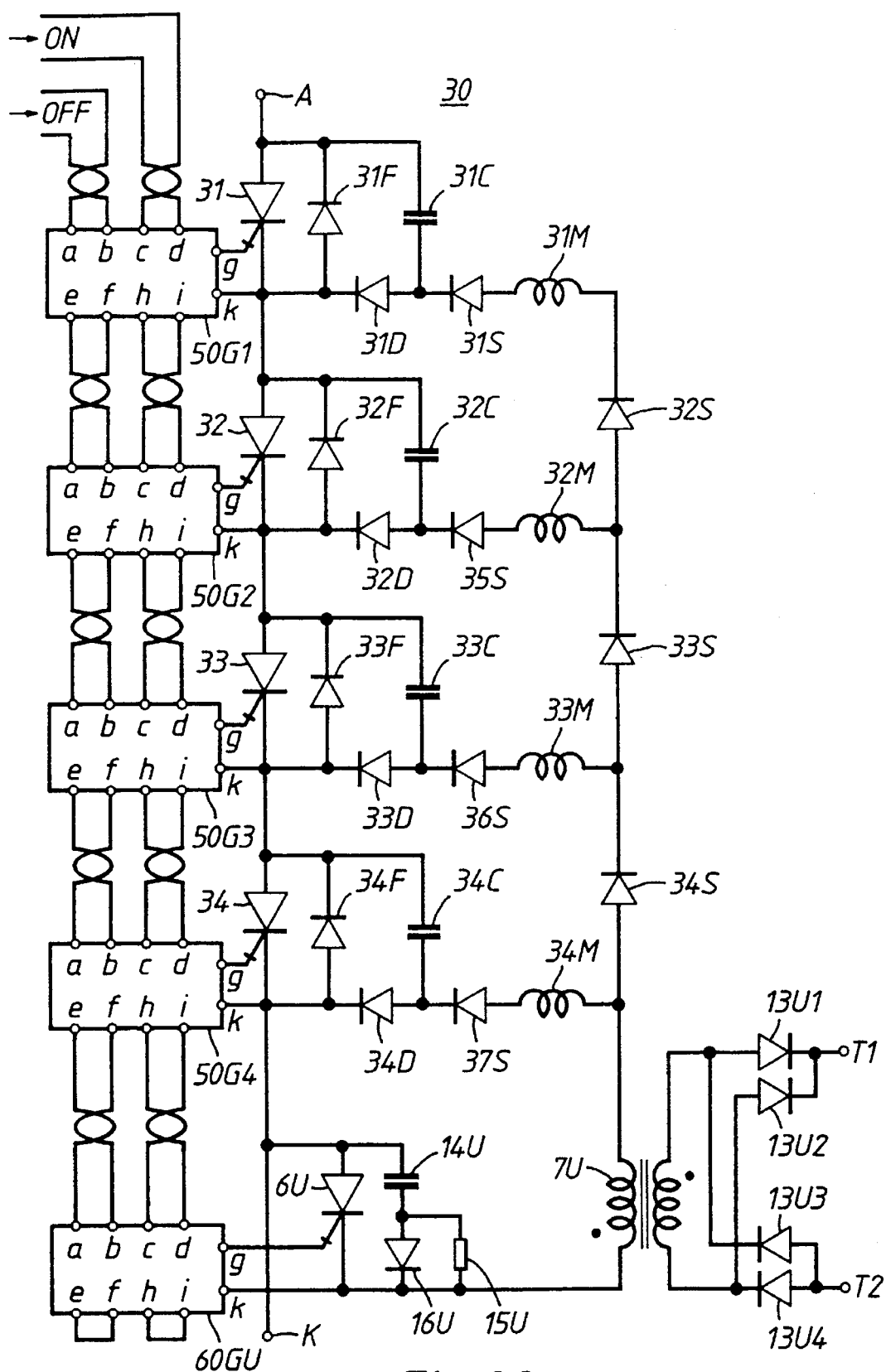
FIG. 22 is a circuit diagram of a GTO module according to a ninth embodiment of this invention.
Figure 23:
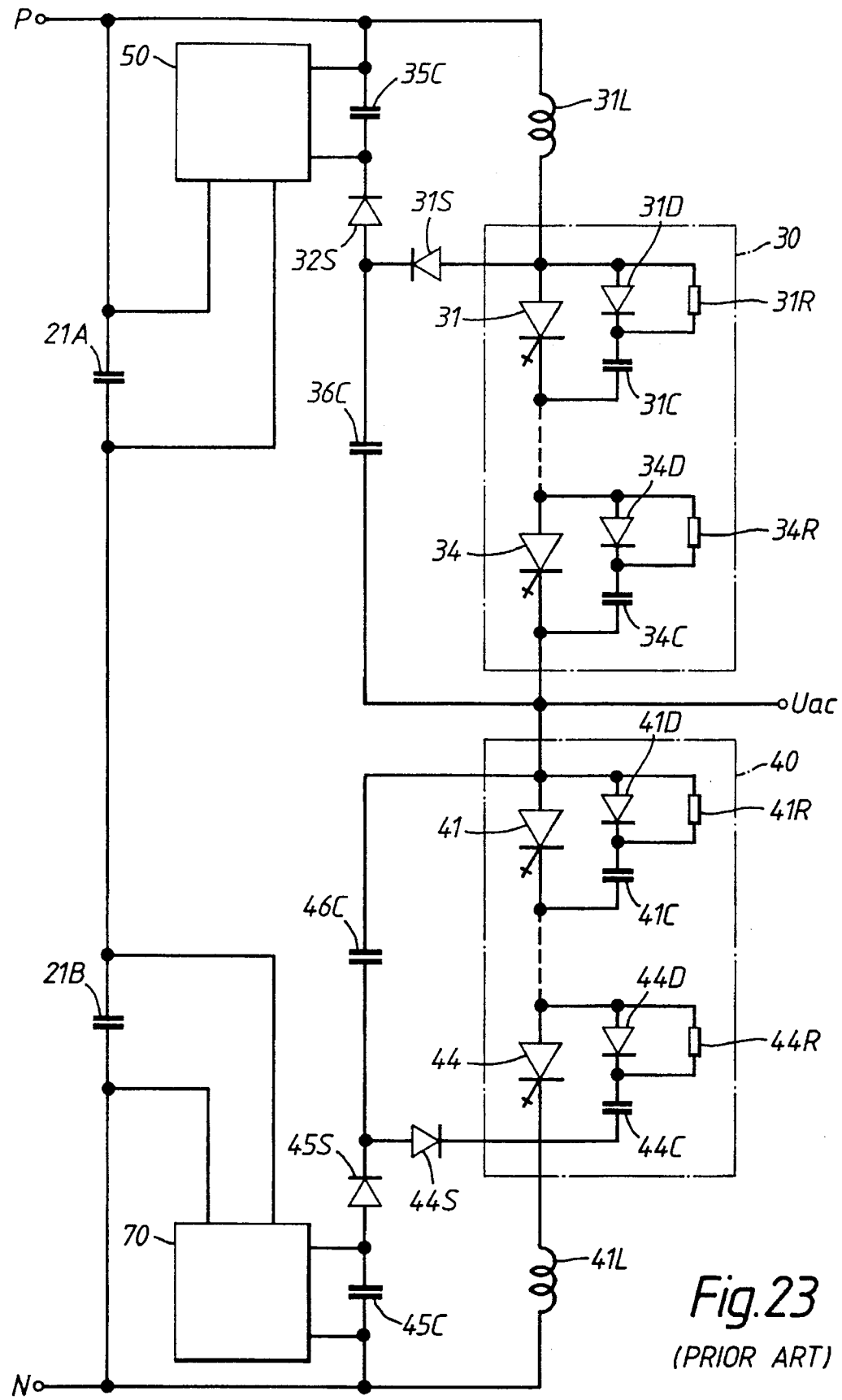
FIG. 23 is a circuit diagram of a part of a prior art power conversion device with snubber energy regenerating circuits.

FIG. 22 shows a ninth embodiment of this invention. In FIG. 22, GTO module 30 is constructed the same as GTO module 40 shown in FIG. 1, with a plurality of GTOs (in this case four) and a snubber energy regenerating circuit. In this case, a construction is possible in which there is series connection of ON/OFF control circuits of the main GTOs and an ON/OFF control circuit for the auxiliary GTO in the snubber energy regenerating circuit. Hereinafter, the ninth embodiment will be described in detail. In FIG. 22, 31 to 34 are main GTOs, 31F to 34F are feedback diodes, 31D to 34D are snubber diodes, 31C to 34C are snubber capacitors, 31S to 37S are diodes, 31M to 34M are reactors, and 50G1 to 50G4 are first gate circuits connected in series, each are having the same construction as that of first gate circuit 50GU of FIG. 16.

Second gate circuit 60GU is connected in series with first gate circuit 50G4 of the last-stage of series connected first gate circuits 50G1 to 50G4. Apart from this, parts which are the same as or correspond to FIG. 14 are given the same reference numerals and further description is omitted. Also, in the case where the system is constituted by connecting a plurality of auxiliary GTOs in series, ON/OFF control of the auxiliary GTOs could be achieved by series connection of second gate circuits 60GU.

The gate control of the GTO module composed of a plurality of GTOs connected in series and a package snubber circuit using a series connected first gate circuits 50G1 to 50G4 and second gate circuit 60GU as described above can be applied to any of GTO modules shown in FIGS. 4, 6, 8, 11, 12 and 13.

As described above, with this invention, the following effects are obtained.

(1) The snubber energy and the energy of the anode reactor of the power conversion device wherein a plurality of self-turn-off devices are connected in series can be regenerated altogether, decreasing the number of parts that generate heat, and enabling the cooling system to be reduced in size.

(2) Since the regenerating transformer can be isolated using the auxiliary switch, the magnetic flux of the regenerating transformer can be reset and saturation can be reliably prevented.

(3) The snubber energy of the auxiliary switch can be regenerated as well.

(4) The ON/OFF control of the main GTOs and the ON/OFF control of the auxiliary switch can be simplifed.

Obviously, numerous modifications and variations of the present invention are possible in light of the above teachings. It is therefore to be understood that within the scope of the appended claims, the invention may be practiced otherwise than as specifically described herein.

What is claimed is:

1. A power conversion device, comprising:

a plurality of bridge connected self-turn-off modules;

each of said self-turn-off modules including;

a plurality of self-turn-off devices connected in series, a plurality of first snubber circuits, each including a first series circuit of a first snubber capacitor and a first snubber diode, each of said first snubber circuits being connected in parallel with one of said self-turn-off devices to form a first parallel circuit, respectively;

a snubber energy regenerating circuit including a regenerating transformer and a first auxiliary switch connected in series with a primary winding of said regenerating transformer, a secondary winding of said regenerating transformer being adapted for connecting to an outer power source;

a plurality of first gate circuits, each for driving one of said self-turn-off devices, respectively, and a second gate circuit for driving said first auxiliary switch, said second gate circuit turning on said first auxiliary switch after said self-turn-off devices are turned on;

said snubber energy regenerating circuit being actuated by turning on of said first auxiliary switch so as to form a plurality of first closed circuits, thereby to discharge energies stored in said first snubber capacitors through said first closed circuits to regenerate said energies to said outer power source through said secondary winding of said regenerating transformer, and each of said first closed circuits including a series circuit of said first auxiliary switch, said primary winding of said regenerating transformer, and one of said first parallel circuits, respectively.

2. The power conversion device according to claim 1, wherein:

said snubber energy regenerating circuit further includes a plurality of power storage means; and each of said power storage means is provided in one of said first closed circuits formed on snubber energy regeneration, for storing a part of said energies discharged from said first snubber capacitors to supply a gate power to one of said first gate circuits, respectively.

3. The power conversion device according to claim 2, wherein:

said first auxiliary switch includes a self-turn-off device; and said snubber energy regenerating circuit further includes a second snubber circuit connected in parallel with said first auxiliary switch to form a second closed circuit including said first auxiliary switch and said second snubber circuit on snubber energy regeneration, and further regenerates an energy stored in said second snubber circuit to said power storage means through said first closed circuits and said second closed circuit.

4. The power conversion device according to claim 2, wherein:

said snubber energy regenerating circuit further includes a plurality of DC/DC converters provided with bypass means; and each of said DC/DC converters is connected to one of said power storage means for supplying said gate power to one of said first gate circuits and for bypassing stored charge in one of said power storage means, respectively.

5. The power conversion device according to claim 2, wherein:

said snubber energy regenerating circuit further includes an anode reactor connected in series with said series connected self-turn-off devices, and a series circuit of a second auxiliary switch and a capacitor connected in parallel with said anode reactor;

said second auxiliary switch is turned on when said self-turn-off devices are turned off to store an energy of said anode reactor in said capacitor; and on snubber energy regeneration, said second auxiliary switch is turned off and said energy stored in said capacitor is regenerated to said outer power source through said secondary winding of said regenerating transformer and to said power storage means.

6. The power conversion device according to claim 1, wherein:

each of said self-turn-off modules includes a GTO module; and each of said self-turn-off devices includes a GTO.

7. A power conversion device, comprising:

a plurality of bridge connected self-turn-off modules;

each of said self-turn-off modules including;
a self-turn-off device,
a snubber circuit including a snubber capacitor, connected in parallel with said self-turn-off device,
a snubber energy regenerating circuit including a regenerating transformer, an auxiliary switch and a reactor, said auxiliary switch and said reactor being connected in series with a primary winding of said regenerating transformer,
a secondary winding of said regenerating transformer being adapted for connecting to an outer power source,
a first gate circuit for driving said self-turn-off device, and
a second gate circuit including a third photocoupler and a fourth photocoupler, for driving said auxiliary switch,
said snubber energy regenerating circuit being actuated by turning on of said auxiliary switch to discharge a snubber energy stored in said snubber capacitor and to regenerate said snubber energy to said outer power source through said secondary winding of said regenerating transformer,
said first gate circuit including;
a first photocoupler to which an ON signal is applied, a first ON gate circuit connected to said first photocoupler for supplying an ON gate current to said self-turn-off device based on said ON signal,
a driving circuit connected to said first photocoupler for applying said ON signal to said third photocoupler of said second gate circuit,
a second photocoupler to which an OFF signal is applied,
a first OFF gate circuit connected to said second photocoupler for supplying an OFF gate current to said self-turn-off device based on said OFF signal, and
a driving circuit connected to said second photocoupler for applying said OFF signal to said fourth photocoupler of said second gate circuit,
said second gate circuit including;
a first pulse generating circuit connected to said third photocoupler to receive said ON signal for generating a first pulse signal with a first pulse width by delaying said ON signal by a first delay time,
a second ON gate circuit connected to said first pulse generating circuit for supplying said first pulse signal, as an ON gate current, to said auxiliary switch,
a second pulse generating circuit connected to said first pulse generating circuit to receive said first pulse signal for generating a second pulse signal with a second pulse width by delaying said first pulse signal by a second delay time, and
a second OFF gate circuit connected to said second pulse generating circuit for supplying said second pulse signal, as an OFF gate current, to said auxiliary switch.

8. The power conversion device according to claim 7, wherein:

said second gate circuit further includes an interruption circuit connected to said fourth photocoupler to receive said OFF signal; and said second OFF gate circuit is further connected to said interruption circuit for supplying said OFF signal, as an OFF gate current at one time only at starting, to said auxiliary switch.

9. A power conversion device, comprising:

a plurality of bridge connected self-turn-off modules;

each of said self-turn-off modules including;
a plurality of self-turn-off devices connected in series,
a plurality of first snubber circuits, each including a first series circuit of a first snubber capacitor and a first snubber diode,
each of said first snubber circuits being connected in parallel with one of said self-turn-off devices to form a first parallel circuit, respectively,
a snubber energy regenerating circuit including a regenerating transformer and a first auxiliary switch connected in series with a primary winding of said regenerating transformer, a secondary winding of said regenerating transformer being adapted for connecting to an outer power source, a plurality of series connected first gate circuits, each for driving one of said self-turn-off devices, respectively, and a second gate circuit for driving said first auxiliary switch, said snubber energy regenerating circuit being actuated by turning on of said first auxiliary switch so as to form a plurality of first closed circuits, thereby to discharge energies stored in said first snubber capacitors through said first closed circuits to regenerate said energies to said outer power source through said secondary winding of said regenerating transformer, each of said first closed circuits including a series circuit of said first auxiliary switch, said primary winding of said regenerating transformer, and one of said first parallel circuits, respectively, each of said first gate circuits including;
a first photocoupler to which an ON signal is applied,
a first ON gate circuit connected to said first photocoupler for supplying an ON gate current to said self-turn-off device based on said ON signal,
a driving circuit connected to said first photocoupler for applying said ON signal to a photocoupler of one of said first gate circuits and said second gate circuit connected in the next stage,
a second photocoupler to which an OFF signal is applied,
a first OFF gate circuit connected to said second photocoupler for supplying an OFF gate current to said self-turn-off device based on said OFF signal, and
a driving circuit connected to said second photocoupler for applying said OFF signal to a photocoupler of one of said first gate circuits and said second gate circuit connected in the next stage, and said second gate circuit including;
a third photocoupler for receiving said ON signal from said first gate circuit,
a first pulse generating circuit connected to said third photocoupler to receive said ON signal for generating a first pulse signal with a first pulse width by delaying said ON signal by a first delay time,
a second ON gate circuit connected to said first pulse generating circuit for supplying said first pulse signal, as an ON gate current, to said auxiliary switch,
a fourth photocoupler for receiving said OFF signal from said first gate circuit,
a second pulse generating circuit connected to said first pulse generating circuit to receive said first pulse signal for generating a second pulse signal with a second pulse width by delaying said first pulse signal by a second delay time, and
a second OFF gate circuit connected to said second pulse generating circuit for supplying said second pulse signal, as an OFF gate current, to said auxiliary switch.

10. The power conversion device according to claim 9, wherein:

said second gate circuit further includes an interruption circuit connected to said fourth photocoupler to receive said OFF signal; and said second OFF gate circuit is further connected to said interruption circuit for supplying said OFF signal, as an OFF gate current at one time only at starting, to said auxiliary switch.

* * * * *